United States Patent
Soluch et al.

(10) Patent No.: US 11,915,582 B2
(45) Date of Patent: Feb. 27, 2024

(54) TRANSMISSION SYSTEM FOR TRANSMITTING OUTPUT UNIT SIGNALS AND CONTROL SIGNALS TO AT LEAST ONE INTERFACE CONNECTED WITH OPTICAL FIBER

(71) Applicant: Neuro Device Group S.A., Warsaw (PL)

(72) Inventors: Pawel Sebastian Soluch, Warsaw (PL); Mateusz Marek Orzechowski, Warsaw (PL); Krzysztof Wrotkowski, Warsaw (PL); Wojciech Obrębski, Warsaw (PL); Pawel Rogowski, Warsaw (PL)

(73) Assignee: Neuro Device Group S.A., Warsaw (PL)

( * ) Notice: Subject to any disclaimer, the term of this patent is extended or adjusted under 35 U.S.C. 154(b) by 157 days.

(21) Appl. No.: 17/612,558

(22) PCT Filed: Apr. 15, 2020

(86) PCT No.: PCT/EP2020/060606
§ 371 (c)(1),
(2) Date: Nov. 18, 2021

(87) PCT Pub. No.: WO2020/128113
PCT Pub. Date: Jun. 25, 2020

(65) Prior Publication Data
US 2022/0223031 A1 Jul. 14, 2022

Related U.S. Application Data

(63) Continuation-in-part of application No. PCT/PL2019/050033, filed on May 31, 2019.

(51) Int. Cl.
*G08C 23/06* (2006.01)
*G01R 33/28* (2006.01)
(Continued)

(52) U.S. Cl.
CPC .......... *G08C 23/06* (2013.01); *G01R 33/283* (2013.01); *G01R 33/4806* (2013.01);
(Continued)

(58) Field of Classification Search
CPC .................. H04Q 11/0067; H04J 14/0227
See application file for complete search history.

(56) References Cited

U.S. PATENT DOCUMENTS

| 10,250,851 B1 * | 4/2019 | Harpur ................. G06V 40/174 |
| 2010/0245543 A1 | 9/2010 | Greer et al. |

(Continued)

FOREIGN PATENT DOCUMENTS

| CN | 109040698 A | 12/2018 |
| EP | 2182659 B1 | 5/2010 |

(Continued)

OTHER PUBLICATIONS

International Search Report and Written Opinion dated Apr. 15, 2020 in PCT/PL2019/050033.

(Continued)

*Primary Examiner* — Shi K Li
(74) *Attorney, Agent, or Firm* — Leydig, Voit & Mayer, Ltd.

(57) ABSTRACT

Described is a transmission system (100 to 1000) including a data output unit (110, 210, 810*b*), for instance a camera operating within MRI environment. In an embodiment, a control transfer unit (812*b* to 812*d*) may manage the operation of the data output unit (110, 210, 810*b*), wherein the control transfer unit (812*b* to 812*d*) may be preferably located closely to data output unit (110, 210, 810*b*), e.g. mounted in vicinity of MRI device (192) or within a radius of less than 5 meters or less than 3 meters from the MRI device (192). The control transfer unit (812*b* to 812*d*) may have one connection or multiple connections to at least one (Continued)

Figure 1:
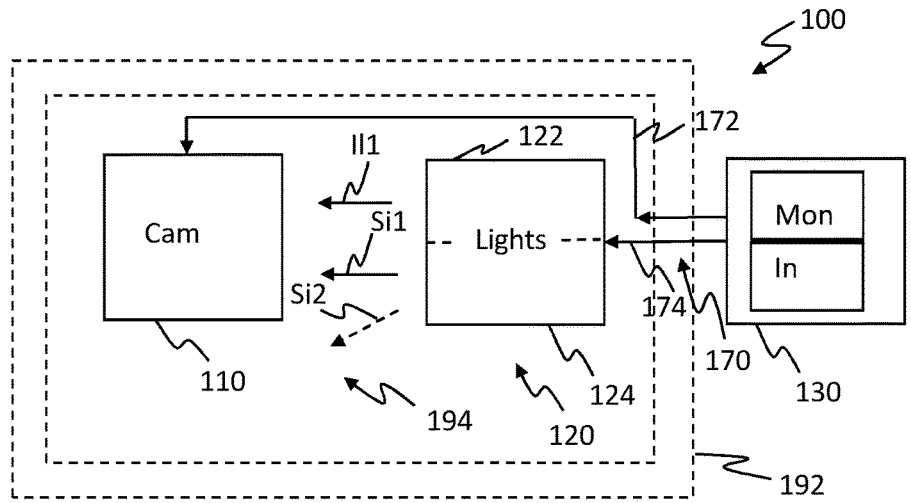

additional secondary control unit, e.g. to sending and receiving units (250, 250*b*1, 250*b*2). Each of the sending and receiving units (250, 250***b*1, 250*b*2) and/or the control transfer unit (812***b* to 812*d*) may be capable of receiving the data from the data output unit (110, 210, 810*b*), send control data/signals and/or acknowledge control data/signals issued by other sending and receiving units (110, 210, 810*b*) and/or by the control transfer unit (812*b* to 812*d*). Each pair of optically coupled units may be connected via single optical fiber connection.

21 Claims, 7 Drawing Sheets

(51) Int. Cl.

| | | |
|---|---|---|
| *G01R 33/48* | (2006.01) | |
| *G06F 3/041* | (2006.01) | |
| *G08C 17/02* | (2006.01) | |
| *H04L 27/04* | (2006.01) | |
| *H04L 27/12* | (2006.01) | |
| *H04N 7/18* | (2006.01) | |
| *H04N 7/22* | (2006.01) | |
| *H04N 23/56* | (2023.01) | |
| *H04N 23/66* | (2023.01) | |

(52) U.S. Cl.
CPC ........... *G06F 3/0416* (2013.01); *G08C 17/02* (2013.01); *H04L 27/04* (2013.01); *H04L 27/12* (2013.01); *H04N 7/183* (2013.01); *H04N 7/22* (2013.01); *H04N 23/56* (2023.01); *H04N 23/66* (2023.01)

(56) References Cited

U.S. PATENT DOCUMENTS

| | | |
|---|---|---|
| 2011/0188861 A1* | 8/2011 | O'Sullivan ............. H04J 14/02 398/81 |
| 2012/0143040 A1 | 6/2012 | Goswami et al. |
| 2014/0354282 A1 | 12/2014 | Kusik et al. |
| 2015/0256723 A1 | 9/2015 | Lei |
| 2017/0168124 A1 | 6/2017 | Ueda et al. |

FOREIGN PATENT DOCUMENTS

| | | | |
|---|---|---|---|
| WO | WO 1999/027847 A2 | 6/1999 | |
| WO | WO 2018/193750 A1 | 10/2018 | |
| WO | WO-2018193750 A1 * | 10/2018 | |
| WO | WO 2020/076171 A1 | 4/2020 | |

OTHER PUBLICATIONS

International Search Report and Written Opinion dated Jul. 16, 2020 in PCT/EP2020/060606.
Neuro Device Camri Brochure available Jun. 20, 2018, https://neurodevice.pl).
R&D Projects / Neuro Device Camri, available May 13, 2019 https://neurodevice.pl.
Images of camera available May 13, 2019 (https://neurodevice.pl), 5 pages.
Camera and the touch screen as described on Applicant's website Jun. 2015, https://web.archive.org/web/20150626004251/http://www.neurodevice.pl/pl/produkty/produkty-neuro-device/kamera-mr., accessed Dec. 30, 2021 (In Polish and English).
Camera and the touch screen as described in Applicant's brochure Jun. 2015, https://web.archive.org/web/20150626004251/http://www.neurodevice.pl/pl/produkty/produkty-neuro-device/kamera-mr., accessed Dec. 30, 2021.
Tietze U. and Schenk, Ch., "Halbleiter-Schaltungstechnik" 10th edition, Springer, 1993, p. 367 to p. 378.

\* cited by examiner

TRANSMISSION SYSTEM FOR TRANSMITTING OUTPUT UNIT SIGNALS AND CONTROL SIGNALS TO AT LEAST ONE INTERFACE CONNECTED WITH OPTICAL FIBER

CROSS-REFERENCE TO RELATED APPLICATIONS

This application is a U.S. National Stage Application under 35 U.S.C. § 371 of International Application No. PCT/EP2020/060606, filed Apr. 15, 2020, which is a continuation-in-part of PCT/PL2019/050033, filed May 31, 2019, both of which are hereby incorporated by reference in its entirety.

The invention relates to a transmission system configured to deliver output unit signals and control signals to at least one interface or to multiple interfaces, wherein each interface may be connected to a control transfer unit (main control unit) via optical fiber connection.

In some environments the use of an electrical connection or of electrical connections to transfer large amount of data/signals and of control signals may be limited. This may refer e.g. to systems working within close distance to magnetic resonance imagining (MRI) devices, wherein strong magnetic field and the use of electromagnetic waves in specific bandwidth, e.g. between 60 MHz (Megahertz) and 130 MHz, may cause an electrical connection to work ineffectively. Furthermore, data transferred electrically in an MRI environment may have negative influence on an amount of artifacts recorded in an MR imaging process. The same problems may also occur in other environments that require precise control of electromagnetic noise. These transmission systems may include for instance video recording systems or multichannel, high sampling rate electrophysiology recording systems, such as EEG (Electroencephalography) systems or ECoG (Electrocorticography, e.g. with electrodes under the bone of the head (dura mater) or ECG (electrocardiography).

These transmission systems may use optical fibers to transfer recorded data/signals. In some instances, it may be preferable to receive these data/signals on multiple interfaces, as well to control the recording system from any one of these multiple interfaces. In such complex condition there may be for instance a problem with the large number of cables connecting all the components of the system, which may be difficult to set up and maintain.

It is an object of this invention to provide an efficient transmission system, especially configured to transfer data and control signals between multiple interfaces with minimized amount of connections between all the components of the system.

In this invention a transmission system including an output unit is proposed, for instance a camera operating within MRI environment. A control transfer unit (main control unit, primary control unit) may manage the operation of the data output unit, wherein the control transfer unit may be preferably located closely to the data output unit, e.g. mounted in vicinity of MRI device or within a radius of less than 5 meters or less than 3 meters from the MRI device. The control transfer unit may have one connection or multiple connections to at least one additional secondary (e.g. indirect control of output unit via a control (transfer) unit) control units, e.g. to sending and receiving units. Each of the sending and receiving units and/or the control transfer unit may be configured to or capable of receiving the data/signals from the output unit, of sending control signals and/or of acknowledging control data/signals issued by other sending and receiving unit and/or by the control transfer unit. The control transfer unit may optionally have a collected data/ collected signals display unit and/or a control data or control signal input unit for manually enter input of control commands.

A transmission system for transmitting data and control signals between multiple optically coupled units is disclosed. At least one pair, at least two pairs, or each pair of optically connected units may be connected via an optical transmission connection based on a respective single optical fiber. The term "single optical fiber" may mean that also bidirectional signal transmission is performed using only one (1) optical fiber instead of two separate fibers that are arranged essentially parallel to each other.

According to a first aspect of the invention, the transmission system may comprise the following optically coupled units:

an output unit that may output collected data or collected signals via a first optical transmission connection that may be realized by a unidirectional or bidirectional first single optical fiber, at least one sending and receiving unit or at least two sending and receiving units, each sending and receiving unit may be configured to simultaneously receive the collected data or the collected signals and to send external control data or control signals via at least one second optical transmission connection that may be realized by at least one bidirectional second single optical fiber. "Simultaneously" may refer to sending and receiving at the same moment.

an optical coupling unit that is coupled optically between the output unit and the at least one sending and receiving unit or between the output unit and the at least two each of the sending and receiving units, and a control transfer unit that may be configured to receive the external control data or control signals from the at least one sending and receiving unit or from the at least two sending and receiving units via the optical coupling unit.

Furthermore, the control transfer unit may be configured to control the output unit depending on the received external control signals or control data, especially to control the output unit solely or exclusively directly.

Thus, the output unit and the optical coupling unit may form a first pair of optical units that are coupled only by a first single optical fiber, for instance a fiber that is used for unidirectional or for bidirectional transmission. The optical coupling unit and the at least one sending and receiving unit may form a second pair of optical units that are coupled only by a first one of at least one second single optical fiber. If the coupling unit is closely attached to the control transfer unit, the first one of the at least one second single optical fiber may also couple the control transfer unit and the at least one sending and receiving unit, e.g. a third pair is coupled. If the control transfer unit comprises a data/signal display unit for the collected data or collected signals, the first single optical fiber may also couple the output unit and the control transfer unit. Thus, a fourth pair of optically coupled units may be formed. Furthermore, the output unit and the at least one sending and receiving unit may be coupled, for instance as a fifth pair, only via the first single optical fiber and the first one of the at least one second single optical fiber. This means, that a serial connection of two single optical fibers is also regarded as a single optical fiber connection as long as no further fibers are used for a parallel data transmission between the respective units and especially not spatial parallel to the single optical fiber connection as it would be the case if one cable was used comprising two or more optical fibers.

There may be further corresponding pairs if at least two sending and receiving units are used. Moreover, also two of the sending and receiving units may form a pair that is coupled only via single optical fiber(s).

This optically coupling of units allows it to reduce the number of fibers that are used to connect the optical units of the transmission system, especially if single optical fibers are used for a bidirectional transmission.

All control data or control signals that are generated by the at least one sending and receiving unit for the output unit may be forwarded exclusively by the control transfer unit to the output unit. In the other transmission direction, all control data or control signals that are generated by the output unit and that have to be sent to the at least one sending and receiving unit may also be forwarded exclusively via the control transfer unit. Thus, the control transfer unit may have a central role in forwarding of control data and/or control signals to and from the output unit. This central role may ease the implementation of special control protocol stacks. Furthermore, the number and lengths of optical transmission connections may be reduced by this central role.

Control data and/or control signals that have to be transmitted between two sending and receiving units of the at least two sending and receiving units may be also be forwarded by the control transfer unit. This may allow to use a comparably simple coupling unit.

Alternatively, the coupling unit may transmit these control data and/or control signals between two SRUs without involving the control transfer unit. This transmission performed by the coupling unit may reduce computation power necessary in the control transfer unit.

Output unit data or output unit signals may be collected data/signals that are generated by the output unit, for instance video signals and/or audio signals and/or physiological signals.

The proposed transmission system may be used within an MRI environment. The output unit and/or the optical coupling unit and/or the control transfer unit may have a distance to an MRI device that is less than 5 meters or less than 3 meters. The transmission system may be used in other medical imaging environments, in other medical environments or in other environments as well.

The output unit may comprise at least one of a camera module, for instance a digital or analog one, an EEG (Electroencephalography) module, an ECoG (Electrocorticography) module which electrodes may be positioned under the bone of the head (dura mater) of a subject or person, or an ECG (electrocardiography) module or another appropriate data output module.

In the context of this application the word "optical" may include visible light, e.g. light in the range of 350 nm (nanometer) to 750 nm, as well as electromagnetic waves in the adjacent infrared and/or ultraviolet range, especially also including infrared (IR) range, e.g. from 750 nm to 1500 nm and/or the short wavelength infrared range of 1500 nm to 3000 nm that is known to be used for optical fibers. Thus, a range of 350 nm to 1500 nm or of 350 nm to 2000 nm or of 350 nm to 3000 nm may be used for instance for the transmission of data. These ranges may refer to the carrier, e.g. light. The frequency of the carries may therefore be in the THz region (Terrahertz). Different from the carrier, the data transmission wave length may be much longer depending on the frequency of modulation. The radio frequency range may be used for modulation of the carrier. Relevant ranges of radio frequencies are mentioned below.

The distances between two respective optically coupled units may be less than 100 meters, less than 50 meters or less than 10 meters. The distance may be more than for instance 1 meter. Thus, the distances may be comparably short. This may enable to use transmitter units and/or receiver units for the transmission of radio frequencies at the end of the specified frequency range or even outside of the specified range.

It may be a minimal requirement that there is at least one sending and receiving unit (SRU). More SRUs may be advantageous for providing a system for multiple interfaces. Two or more SRUs may be used for instance in the following cases:

Case 1:
The control transfer unit (CTU) may be located near an MRI (magnetic resonance imaging) device, e.g. allowing easy access to it. The control transfer unit may be used for instance by the personnel during the preparation of a subject for the examination/study/data recording. However, an input function may be optional for the control transfer unit.
A first SRU may be located at the desk of a technician in a control room, e.g. the first SRU may be used by him/her for supervising ongoing data acquisition.
A second SRU may be located by a gate to an MRI room. The gate may not always comprise the doors leading directly to the control room. This second SRU may be used by medical personnel supervising the condition of the subject and ready for quick reaction in emergency situation.

Case 2: In case the CTU could not be located with easy access during all steps of subject preparation, e.g. it may be required to access subject form both sides of the MRI device, one of the SRUs may be used for that. The other SRU that may be used in the setup may be the same as in case 1 (1st and/or 2nd).

Case 3: There may be a few technicians involved in supervising various parameters during the trial. It may happen that one of them is in a control room and the other is in a technical room. These rooms may be two different rooms, e.g. the control room may comprise a computer for control and visualization of data, while in the technical room there may be heavy technical equipment located and some additional hardware may be used only from there. The details may depend on individual MRI device setup and for instance on the availability of MRI patch panels and/or waveguides in various rooms.

Even one SRU may provide control. The control transfer unit may be the main unit or the primary unit controlling the output unit. The control transfer unit may forward control data or control signals received from the at least one SRU to the output unit using for instance electrical communication, e.g. a power-line communication or other kinds of electrical communication. Alternatively, other kinds of communication may be used between the CTU and the output unit for control purposes. Thus, the at least one SRUs may not have or must not have a connection to control the output unit directly, for instance electrically or in other ways. This may allow short optical fiber length and/or a low number of optical fibers. Further, this may prevent the implementation of complex protocol stacks within the SRU(s). Furthermore, specific transmission protocols may be only appropriate for some of the transmission connections.

Thus, the at least one SRU may send the control signal/control data to the CTU for signal conversion and/or for forwarding in an appropriate format. The CTU may manage the control signals/control data coming from various SRUs. Alternatively, only control data or control signal forwarding without data/signal conversion may take place in the CTU.

The transmission system may comprise a first sending and receiving unit of the at least one sending and receiving unit or of the at least two sending and receiving units. The first sending and receiving unit may comprise:
- a receiver unit that comprises an optoelectronic input element that receives light and outputs an electrical signal, and
- a transmitter unit that comprises an optoelectronic output element that converts an electrical signal in a light signal.

The first sending and receiving unit may be optically coupled to the optical coupling unit by a first one of the at least one second optical transmission connection.

Additionally, the transmission system may comprise a second sending and receiving unit of the at least two sending and receiving units. The second sending and receiving unit may comprise:
- a receiver unit that comprises an optoelectronic input element that receives light and outputs an electrical signal, and
- a transmitter unit that comprises an optoelectronic output element that converts an electrical signal in a light signal.

The second sending and receiving unit may be optically coupled to the optical coupling unit by a second one of the at least one second optical transmission connection.

The first sending and receiving unit and the second sending and receiving unit may comprise the same types of receiver units and/or transmitter units as well as the same types of radio transceiver circuitry, for instance the types as mentioned below. Thus, a modular system is used that may reduce the overall costs considerable. The SRU may form one type o modules of the transmission system.

The first sending and receiving unit may be connected to the optical coupling unit only by the first one of the at least one second optical transmission connection. Further, the second sending and receiving unit may be connected to the optical coupling unit only by the second one of the at least one second optical transmission connection. Thus, no additional fibers may be necessary for coupling the sending and receiving unit(s) to the transmission system, especially to the optical coupling unit. Installation costs and maintenance cost may be reduced thereby.

The output unit may comprise a transmitter unit that comprises an optoelectronic input element that converts an electrical signal into a light signal. The transmitter unit of the output unit and the transmitter unit of the first sending and receiving unit may be configured to transmit at the same time, e.g. synchronously, especially via the same single optical fiber. The transmitter unit of the output unit and the transmitter unit of the second sending and receiving unit may also be configured to transmit at the same time, e.g. synchronously. Different frequency ranges may be used to avoid conflicts.

The control transfer unit may be configured to be coupled or may be coupled to the optical coupling unit by a receiver unit that is configured to receive the external control data or control signals. Moreover, the control transfer unit may be configured to be connected or may be connected to one side of a control connection between the control transfer unit and the output unit. The output unit may be configured to be connected or may be connected with another side of the control connection. The control transfer unit may comprise a forwarding unit that forwards the control data or control signal via the control connection to the output unit.

The control connection may be a part of the transmission system. Alternatively, the control connection may be a separate component that does not belong to the transmission system. The output unit may by be controlled by the control data or control signals that are received via the control connection, e.g. parameters may be set, parameters may be read and/or functions of the output unit may switched on or switched off.

The control connection may not include or comprise the optical coupling unit. The control connection may be a separate physical connection with regard to the at least one first optical transmission connection and/or with regard to the at least one second optical transmission connection. The control connection may be configured to use at least one communication protocol and/or physical communication interface that is different from a communication protocol and/or physical communication interface which is used for the transmission via the at least one first optical transmission connection and/or for to the transmission via the at least one second optical transmission connection. There may be the technical effect that a protocol that is used to control the output unit directly has only to be implemented in the control transfer unit but not in the at least one sending and receiving unit or the at least two sending and receiving units. The protocol used on the control connection may be different from a protocol that is used by the SRU(s).

Further, the same control connection may be used for multiple sending and receiving units. The control connection may comprise a wired connection, e.g. electrically conductive or non-conductive (for instance optical fiber), or a wireless connection, for instance using electromagnetic waves, light, ultrasonic etc.

Thus, the physical principle for control data/signal transmission may be different on the control connection compared to the other optical transmission connections in the transmission system, e.g. electrically versus optically.

The control transfer unit may comprise an input unit, preferably a touch screen device, a keyboard, a touchpad etc. The input unit may be configured to receive manual input in order to control the operation of output unit. Thus, a further input unit may be realized with low overhead. The direct manual input may be made especially without involving the at least one sending and receiving unit or the at least two sending and receiving units.

The control transfer unit may comprise a transmitter unit that comprises an optoelectronic output element that may convert an electrical signal in a light signal and that may be configured to be optically coupled or that may be optically coupled to the optical coupling unit. Broadcom® Inc. transmitters may be used, for instance of type HFBR-14XXZ, or transmitters of other types or of other companies.

The control transfer unit may be configured to send control data or control signals by the transmitter unit to the at least one sending and receiving unit or to the at least two sending and receiving units. This may be done for instance in order to acknowledge control data or control signals, to send status control data/signals or for other control purposes, etc.

The control transfer unit may comprise a receiver unit that may comprise an optoelectronic output element that converts a light signal in an electrical signal and that may be configured to be optically coupled or that may be optically coupled to the optical coupling unit. Broadcom® Inc. receivers may be used, for instance of type HFBR-24XXZ, or receivers of other types or of other companies.

Further, the control transfer unit may be configured to receive the collected data or the collected signal from the output unit via the optical coupling unit by the receiver unit. Additionally or alternatively, the control transfer unit may be configured to receive the external control data or control signals via the receiver unit. Thus, the same receiver unit may be used for two purposes.

The control transfer unit may comprise a display device that is configured to display data that is received from the output unit via the receiver unit, preferably a touch screen device. The display device may be used also as an input unit. Thus a further location for displaying collected data or collected signals and/or for generating control data/signals in addition to SRU(s) may be realized cost-efficiently. Touch screen devices may be preferred in medical environment because cleaning and disinfection is easy possible.

The optical coupling unit may be an optical splitting unit comprising at least two ports, e.g. a first port and a second port. However, the optical splitting unit may comprise three ports, four ports or more than four ports. Furthermore, the optical splitting unit may comprise a first splitting member and a second splitting member. In other embodiments the optical splitting unit may comprise more than two splitting members. The splitting members may be individual components or may be integrated on a common carrier.

Thorlabs® Inc. splitting members may be used or splitting members of other companies. Splitting members may have four ports or only three ports. However, a three port splitting member may be realized by leaving one port of a four port splitting member unused or using a reflecting element on one port. Coupling ratios of the splitting members may be selected appropriately, for instance coupling ratios of 90 percent to 10 percent, i.e. 90:10 (with reference to power), 50:50 (power) or other values. The wavelength ranges of the splitting members may also be selected appropriately, for instance in the range of 450 nm to 1600 nm or within another wavelength. Furthermore, narrowband splitting member, e.g. plus/minus 15 nm, or a wideband splitting members, e.g. plus/minus at least 50 nm, may be used depending on the application.

In a basic configuration that may be valid for several embodiments, the first splitting member may comprise a first port, a second port, a third port and a fourth port. The second splitting member may also comprise a first port, a second port, a third port and a fourth port. There may be the following connections in the basic configuration: —the first port of the optical splitting unit may be connected to the first port of the first splitting member,
the second port of the splitting unit may be connected to the fourth port of the second splitting member,
the fourth port of the first splitting member may be connected to the first port of the second splitting member, and
the third port of the first splitting member may be connected to the third port of the second splitting member.

A port may be an external port or an internal port. An external port may comprise a connector, for instance a socket or plug which is appropriate to be couplet to a second connector. Alternatively the external port may comprise a splice connection. FC/APC (Fiber-optic Connector/Angled Physical Contact) connectors or other types of connectors may be used. An internal port may be an internal circuit node that does not comprise a connector or a pair of connectors or that does alternatively comprise at least on connector or a pair of connectors.

The first port of the optical coupling unit/optical splitting unit may be an external port. The second port of the optical coupling unit/optical splitting unit may be an external port if only one sending and receiving unit is used. In this case the at least one second optical transmission connection may be connected to the second port.

The second port of the optical coupling unit/optical splitting unit may be an internal port if at least two sending and receiving units are used. There may be at least one further optical coupling or splitting element that is coupled between the at least two sending and receiving units and the optical coupling unit/optical splitting unit in this case.

Figure 8:
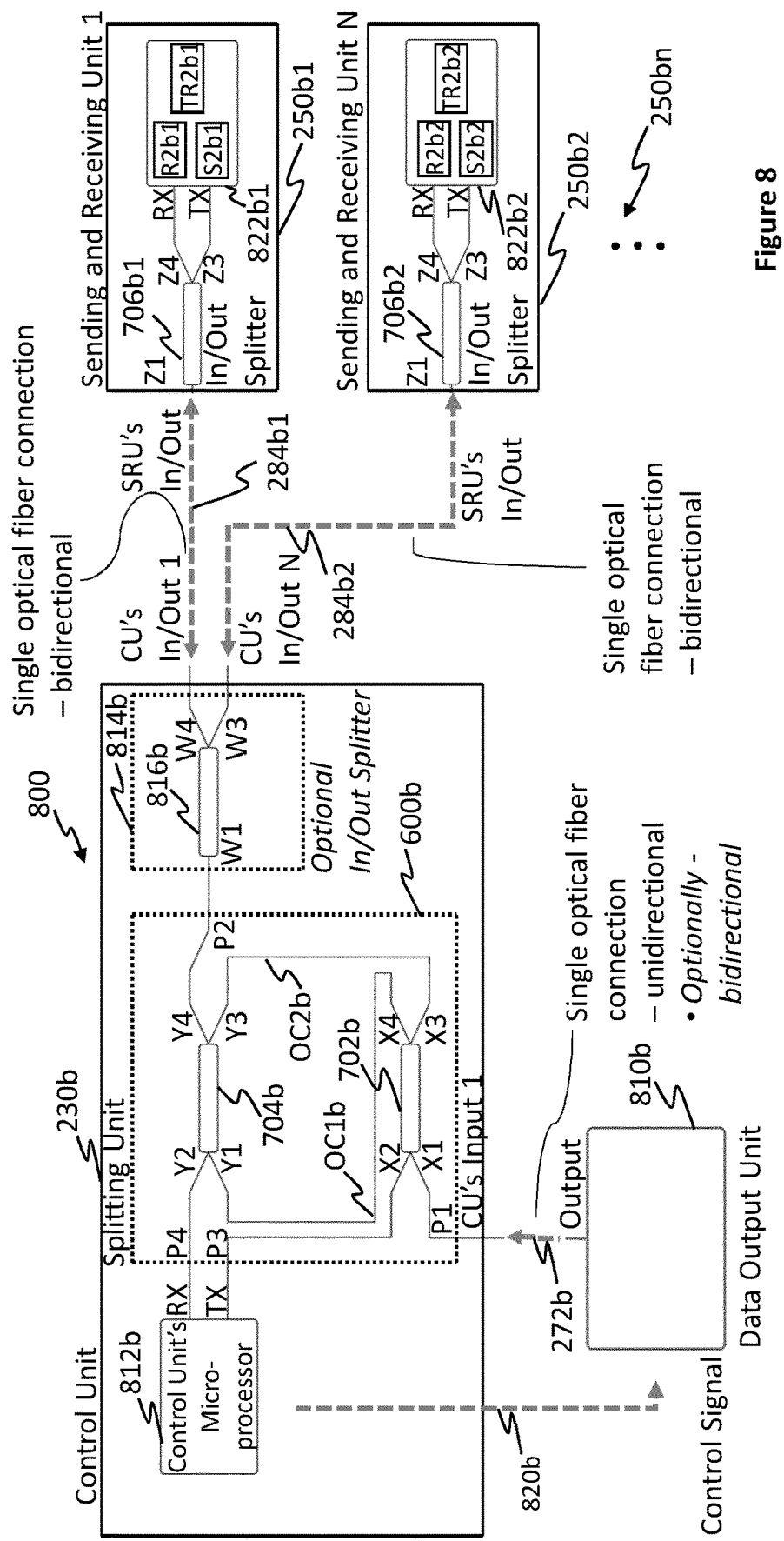

The optical splitting unit may comprise a third port and a fourth port. The third port of the optical splitting unit may be connected to the second port of the first splitting member. The fourth port of the optical splitting unit may be connected to the second port of the second splitting member. The third port and the fourth port of the optical coupling unit/optical splitting unit may be external ports. FIG. 8 that is described below in detail is an example for this configuration.

If the optical coupling unit/optical splitting unit comprises four ports, the optical coupling unit may be configured in the basic configuration to forward collected data/signals of the output unit from the first port to the second port and/or to the fourth port, to forward control data/signals from the third port to the second port and/or to forward control data/signals from the second port to the fourth port.

According to a further embodiment the optical splitting unit may also comprise a third port and a fourth port as well as a third splitting member and a fourth splitting member. The third splitting member may comprise a first port, a second port and a third port. The fourth splitting member may also comprise a first port, a second port and a third port. There may be the following connections within the optical splitting unit:
the first port of the third splitting member may be connected to the second port of the second splitting member,
the second port of the third splitting member may be a fourth port of the optical splitting unit,
the third port of the third splitting member may be connected to the second port of the fourth splitting member,
the first port of the fourth splitting member may be connected with the second port of the first splitting member, and
the third port of the fourth splitting member may be a third port of the optical splitting unit.

Figure 9:
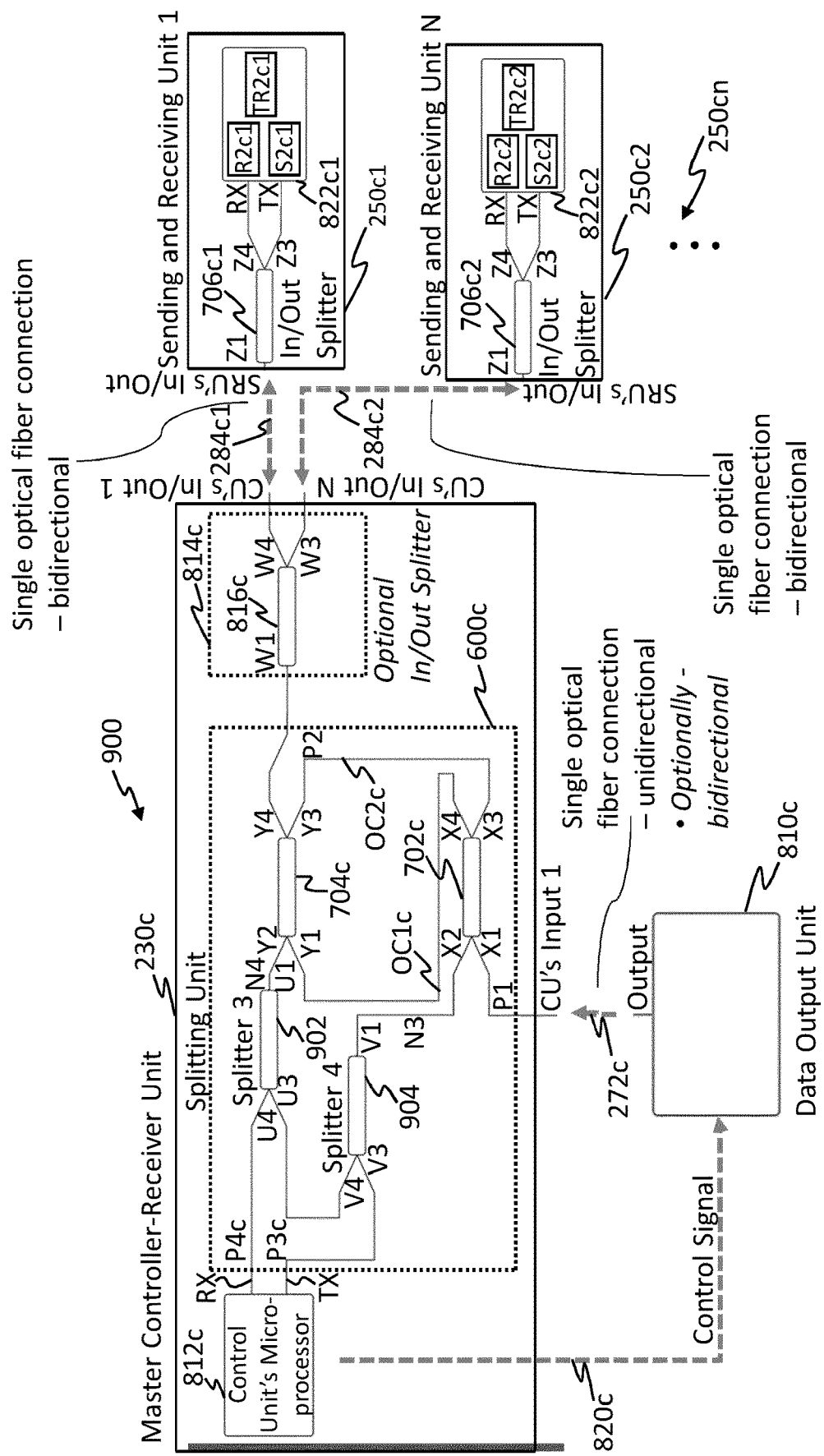

An example for this embodiment is shown in FIG. 9 and is described in the second part of this application in more detail. Multiple sending and receiving units may directly receive information on control data or control signals coming from one of the other sending and receiving unit(s), especially without involving the control transfer unit (CTU) if at least four splitting members are used within the optical splitting unit.

According to a further alternative, the optical splitting unit may comprise a third splitting member. The third splitting member may comprise a first port, a second port and a third port. There may be the following connections within the optical splitting unit:
the second port of the third splitting member may be connected to the second port of the second splitting member,
the third port of the third splitting member may be connected to the second port of the first splitting member, and the first port of the third splitting member may form a third port and/or a fourth port of the optical splitting unit.

The first port of the third splitting member may be coupled to a third optical transmission connection that is realized by a bidirectional third single optical fiber. The third single optical fiber may be the only connection between the optical coupling unit/optical splitting unit and the control transfer unit.

Thus the control transfer unit may be located in a distance from the optical coupling unit/optical splitting unit. The distance may be at least 1 meter, at least 2 meters or at least 3 meters but preferably less than 100 meters or less than 10 meters. Thus the control transfer unit may be a detached or separated unit with regard to the optical coupling unit/optical splitting unit. This scenario is explained in more detail below with reference to FIG. 10.

The separate optical coupling unit may be a unit without current supply or voltage supply because only passive optical elements are used within the optical coupling unit. Furthermore, the separate optical coupling unit may have separate housing compared to a housing of the control transfer unit. There may be no other parts than the parts that are mentioned within the separate optical coupling unit, especially no electrical control unit, e.g. no processor unit or no state machine.

In an alternative embodiment of the transmission system that comprises for instance a separate optical coupling unit, the optical splitting unit may comprise in addition tho the four splitting members mentioned above a fifth splitting member. The fifth splitting member may comprise a first port, a second port and a third port. There may be the following connections:
  the second port of the fifth splitting member may be connected to the fourth port of the optical splitting unit,
  the third port of the fifth splitting member may be connected to the third port of the optical splitting unit, and
  the first port of the fifth splitting member may form a fifth port and/or a sixth port of the optical splitting unit.

This configuration may be a combination of the examples that are explained in more detail below with reference to FIGS. 9 and 10. The resulting technical effects are that there is a separate optical coupling unit and that the sending and receiving units may send and receive control data or control signals from other sending and receiving units without involving the control transfer unit which may therefore need less computation power.

Alternatively or in addition to the embodiments that are mentioned above, the optical splitting unit may comprise an input/output splitting unit. The input/output splitting unit may comprise a first port, a second port and at least a third port. There may be the following connections:
  the first port of the input/output splitting unit may be connected to the second port of the optical splitting unit,
  the second port of the input/output splitting unit may be a further port of the optical splitting unit, and
  the third port of the input/output splitting unit may be another port of the splitting unit that is different from the further port of the splitting unit.

If there are at least two sending and receiving units, an input/output splitting unit may be used between the optical coupling unit/optical splitting unit and the at least two sending and receiving units. The respective second optical transmission connections may be coupled to the input/output splitting unit. The input/output splitting unit may be part of the optical coupling unit/optical splitting unit, i.e. there may be only a single case or housing for both units. Thus, the number of different parts may be reduced. Alternatively, the input/output splitting unit may be detached from the optical coupling unit/optical splitting unit, e.g. each unit may have its own outer case or housing. Modularity is increased if separate units are used.

With regard to the external connections of the optical coupling unit, there may be at least a first port, a second port, a third port and a fourth port:
  the first port may be connected to the first optical transmission connection between the optical coupling unit and the output unit,
  the second port may be connected to at least one of the second optical transmission connections between the optical coupling unit and the at least one sending and receiving unit or between the optical coupling unit and the at least two sending and receiving units,
  the third port may be connected to the control transfer unit, e.g. a receiving port of the optical coupling unit,
  the fourth port may be also connected to the control transfer unit, e.g. a transmitting port of the optical coupling unit.

The optical coupling unit may be configured to forward collected data/signals of the output unit from the first port to the second port and/or to the fourth port, to forward control data/signals from the third port to the second port and/or to forward control data/signals from the second port to the fourth port.

The output unit may be configured to output at least one of the following collected data/signals; video data or a video signals and/or to output audio data or audio signals and/or to output physiological data or at least one physiological signal. The physiological data/signals may be data/signals generated using EEG, ECoG and/or EKG modules as mentioned already above.

According to a further embodiment, the optical coupling unit may be comprised in one housing together with the control transfer unit forming preferably a control unit. Thus, the number of modules in the transmission system is reduced. Depending on the location of the other units, a common unit may result in minimal length of optical fibers.

The optical coupling unit may be a separate unit from a control unit that comprises the control transfer unit as was already mentioned above. The optical coupling unit may comprise a separate housing that is separate from a housing of the control unit.

At least some units of the transmission system may be configured to operate in an environment comprising artificial (i.e. in addition to the magnetic field of the earth) magnetic fields of at least 0.5 T (Tesla), at least 1 T or at least 2 T, and/or comprising strong electromagnetic fields. Furthermore, these units may operate in an MRI device environment, preferably within an radius of less than 5 meters or less than 3 meters from the MRI device, especially the control transfer unit and/or the output unit and/or the optical coupling unit.

EMC (Electromagnetic Compatibility) shielding may be used or other measures that are mentioned in this application with regard to EMC may be applied for units within strong magnetic fields or strong electromagnetic fields. At least some of the components of the transmission system may be exposed to high magnetic fields, for instance the output unit and/or the control transfer unit and/or the optical coupling unit. However, alternatively the transmission system may be used in another environment than MRI, especially in an environment having no magnetic field, except the magnetic field of the earth.

The first receiving and sending unit of the at least one sending and receiving unit or of the at least two sending and receiving units may comprise a radio transceiver circuitry that is connected to the optical transmitter unit of the first receiving and sending unit and to the optical receiver unit of the first receiving and sending unit. Alternatively or additionally, the first sending and receiving unit may comprise:
 a) at least one interface unit to at least one computing device, or
 b) alternatively at least one computing device.

The second receiving and sending unit of the at least two sending and receiving units may also comprise a radio transceiver circuitry that is connected to the optical transmitter unit of the second receiving and sending unit and to the optical receiver unit of the second receiving and sending unit. Alternatively or additionally, the second sending and receiving unit may comprise:
 a) at least one interface unit to at least one further computing device, or
 b) alternatively at least one further computing device.

The computer device(s) may be configured for image processing and/or displaying of images based on the collected data/signals of the output unit. Alternatively or additionally, the computer device(s) may be configured to process other collected data/signals of the output unit as mentioned above, for instance audio data and/or physiological data.

Analog Devices® Inc. radio transceivers may be used, for instance of type ADF7020-x, e.g. ADF7020-1, or radio transceivers of other types or of other companies.

The radio transceiver circuitry of the first receiving and sending unit of the at least one sending and receiving unit or of the at least two sending and receiving units may be configured to perform a frequency shift keying (FSK) and/or an amplitude shift keying (ASK), preferably in the radio frequency range. The radio transceiver circuitry of the second receiving and sending unit of the at least two sending and receiving units may be configured to perform a frequency shift keying (FSK) and/or an amplitude shift keying (ASK), preferably in the radio frequency range. FSK and ASK may be regarded as modulation schemes that allow to reduce transmission errors.

The radio transceiver may receive and/or transmit in a frequency range of at least or over 125 MHz, preferably using a transmission frequency in the range of 140 MHz to 180 MHz or a transmission frequency in the range of 145 MHz to 152 MHz, for instance of 148 MHz. These frequencies may be appropriate within an MRI environment. Furthermore, optical transmitter units and/or of receiver units may be used that are specified for these frequency ranges or that are not specified for such high frequency ranges but do nevertheless allow the transmission of signals within these frequency ranges, for instance about comparably short transmission lengths of less than 50 meters, less than 20 meters or less than 10 meters. The transmission length may be more than 1 meter or more than 3 meters or more than 5 meters. Mono-mode fibers or multi-mode fibers may be used.

The output unit may be configured to transmit collected data or signals within a transmission bandwidth in the range of 0 MHz to 60 MHz. Additionally or alternatively the transmission system may be configured to transmit control signals or control data using transmission bandwidth over 125 MHz, preferably using a transmission frequency in the range of 140 MHz to 180 MHz or a transmission frequency in the range of 145 MHz to 152 MHz, for instance of 148 MHz.

These frequency ranges may be appropriate for MRI environments. Furthermore, optical transmission connections, especially single optical fibers and/or mono-mode fibers may be used. There may be for instance comparably short transmission lengths of less than 50 meters, less than 20 meters or less than 10 meters. The transmission length may be more than 1 meter or more than 3 meters or more than 5 meters. However, multi-mode fibers may also be used. In other embodiments the control data/signal may be transmitted in a lower frequency range compared to the frequency range that is used to the transmission of the collected data/signals of the output unit, for instance of a camera module or a module that detects physiological parameters, e.g. EEG.

A second aspect of the invention relates to an embodiment A of a transmission system for transmitting output unit signals and control signals via an optical transmission connection, comprising:
 a first transmitter unit that comprises an optoelectronic output element that converts an electrical signal in a light signal. The first transmitter unit may be comprised in an output unit.
 a receiver unit that comprises an optoelectronic input element, wherein the optoelectronic input element receives light and outputs an electrical signal. The receiver unit may be comprised in a control transfer unit or in a control unit.
 an optical transmission connection arranged between the first transmitter unit and the receiver unit, e.g. between the output unit and the control unit,
 an output unit that is connected to the first transmitter unit,
 a second transmitter unit that comprises an optoelectronic output element that converts an electrical signal in a light signal. The second transmitter unit may be comprised in the control (transfer) unit.
 an optical splitting unit that is coupled between the optical second transmitter unit and at least a segment of the optical transmission connection.

Embodiment B: Transmission system according to embodiment A, wherein the second transmitter unit may be part of a control unit that may be named as a control transfer unit as mentioned above and that receives control data or control signals from a sending and receiving unit and that forwards these received control data or control signals to the output unit. The output unit may be camera module.

The transmission system may comprise a radio frequency signal generation unit that generates a radio frequency signal using a control signal or control data and which radio frequency signal generation unit has an output node which is connected to the second transmitter unit. The radio frequency signal generation unit may be comprised in a transceiver unit. A receiver input of the radio transceiver unit may be connected with the receiver unit, especially with the receiver unit of a control unit or of a control transfer unit. The technical effects that are mentioned above are also valid for the second aspect.

The control transfer unit may comprise an input unit, preferably a touch screen device that is configured to control the operation of the output unit. The technical effects that are mentioned above do also apply to embodiment B.

The sending and receiving unit may be coupled to the optical splitting unit only by a single optical fiber. This does not exclude connectors at the end of the optical fibers and/or a serial connection of single optical fibers as defined above for the first aspect. The single optical fiber may form at least 50 percent or at least 90 percent of the length of the transmission connection between the sending and receiving unit and the optical splitting unit. The same technical effects as mentioned above may be realized.

Embodiment C: Transmission system according to embodiment A or B, wherein the output unit is configured to transmit data or signals within a transmission bandwidth in the range of 0 MHz to 60 MHz. Alternatively or additionally, the transmission system is configured to transmit control signals or control data using transmission bandwidth over 125 MHz, preferably using a transmission frequency in the range of 140 MHz to 180 MHz or a transmission frequency in the range of 145 MHz to 152 MHz, for instance of 148 MHz. The technical effects that are mentioned above for the first aspect are also valid for this embodiment C of the second aspect.

Embodiment D: Transmission system according to any one of the embodiments A to C, wherein the optical transmission connection consists only of a single optical fiber transmission connection. Alternatively or additionally, the first transmitter unit is arranged at a first end of the optical transmission connection and the receiver unit and the second transmitter unit are arranged at a second end of the optical transmission connection. The technical effects that are mentioned above for the first aspect are also valid for this embodiment D of the second aspect.

Embodiment E: Transmission system according to embodiment D, wherein the first transmitter unit and the second transmitter unit are configured to transmit at the same time or synchronously. The technical effects that are mentioned above for the first aspect are also valid for this embodiment E of the second aspect.

Embodiment F. Transmission system according to any one of the embodiments A to E, wherein the optical splitting unit comprises at least a first port, a second port, a third port and a fourth port. There may be the following connections:
the first port is connected to an optical connection between a control unit and the camera module,
wherein the second port is connected to an optical connection between the control unit and a receiving and sending unit,
the third port is connected to the control unit,
the fourth port is connected to the control unit,
wherein the optical splitting unit is configured to forward image or video data from the first port to the second port and/or to the fourth port, to forward control data from the third port to the second port and/or to forward control data from the second port to the fourth port. The technical effects that are mentioned above for the first aspect are also valid for this embodiment F of the second aspect.

Embodiment G: Transmission system according to embodiment F, wherein the optical splitting unit comprises a first splitting member and a second splitting member. Thus, the optical splitting unit may have a comparably simple structure but is able to fulfill multiple transmission functions between its ports.

Embodiment H: Transmission system according to embodiment G, wherein the first splitting member comprises a first port, a second port, a third port and a fourth port and wherein the second splitting member comprises a first port, a second port, a third port and a fourth port. The technical effects that are mentioned above for the first aspect are also valid for this embodiment H of the second aspect.

Embodiment I: Transmission system according to embodiment H, wherein:

the first port of the splitting unit is connected to the first port of the first splitting member,
the second port of the splitting unit is connected to the fourth port of the second splitting member,
the third port of the splitting unit is connected to the second port of the first splitting member,
the fourth port of the splitting unit is connected to the second port of the second splitting member,
the fourth port of the first splitting member is connected to the first port of the second splitting member, and
the third port of the first splitting member is connected to the third port of the second splitting member. The technical effects that are mentioned above for the first aspect are also valid for this embodiment of the second aspect.

Embodiments A to I may be used in an MRI environment as mentioned for the first aspect or in another environment. Furthermore, embodiments A to I may be combined with at least on feature or with several features that are mentioned above for the first aspect, for instance using ASK and/or FSK for radio frequency transmission.

The making and using of the presently preferred embodiments and of further embodiments are discussed in detail below. It should be appreciated, however, that the present disclosure provides many applicable concepts that can be embodied in a wide variety of specific contexts. The specific embodiments discussed are merely illustrative of specific ways to make and use the disclosed concepts, and do not limit the scope of the claims.

Moreover, same reference numerals refer to same technical features if not stated otherwise. As far as "may" is used in this application it means the possibility of doing so as well as the actual technical implementation. The present concepts of the present disclosure will be described with respect to preferred embodiments below in a more specific context namely a system for communicating with a subject during magnetic resonance imaging (MRI). The disclosed concepts may also be applied, however, to other situations and/or arrangements as well, for instance for communicating with a subject during other kinds of imaging, especial imaging in a medical context. Furthermore, the proposed system may be used to communicate with subjects that are treated with medical devices, for instance with radiology devices or with other devices.

The foregoing has outlined rather broadly the features and technical advantages of embodiments of the present disclosure. Additional features and advantages of embodiments of the present disclosure will be described hereinafter. These features may be the subject-matter of dependent claims. It should be appreciated by those skilled in the art that the conception and specific embodiments disclosed may be readily utilized as a basis for modifying or designing other structures or processes for realizing concepts which have the same or similar purposes as the concepts specifically discussed herein. It should also be recognized by those skilled in the art that equivalent constructions do not depart from the spirit and scope of the disclosure, such as defined in the appended claims.

For a more complete understanding of the presently disclosed concepts and the advantages thereof, reference is now made to the following description in conjunction with the accompanying drawings. The drawings are not drawn to scale. In the drawings the following is shown in:
FIG. 1 an overview over an MRI camera system,
FIG. 2 the general configuration of the video part and of the control part of the MRI camera system, FIG. 3 a frame head used for carrying parts of the system including a multicolor optical signal device, FIG. 4 a frame of a holder device, FIG. 5 a control device for the RGB LEDs, FIG. 6 a video signal transmission part and a control signal transmission part of the MRI camera system, FIG. 7 a splitting unit that is part of a control unit, FIG. 8 a transmission system for output unit data or signals comprising several sending and receiving units, FIG. 9 a first alternative of the transmission system of FIG. 8 wherein a splitting unit comprises four splitting members, and FIG. 10 a second alternative of the transmission system of FIG. 8 comprising an independent splitting unit or other optical coupling unit.

FIG. 1 illustrates an overview over an MRI (Magnetic Resonance Imaging) camera system 100. System 100 comprises:
- a camera device 110, for instance generating an analog signal, for instance PAL (Phase Alternating Line) or NTSC (National Television Systems Committee, US) or a digital signal, for instance 720×576 pixel (PAL) or 720×480 pixel (NTSC). It is possible to generate monochrome or color signals within camera device 110.
- an optical output device 120, and
- a control unit 130 that may comprise a display or a monitor Mon and an input device In, for instance both the monitor Mon and the input device In as part of a touch screen.

Camera device 110, Cam and optical output device 120 may be separate devices. However, in the preferred embodiment camera device 110, Cam and optical output device 120 are arranged within the same housing and it may be said that the optical output device 120 is integrated within the camera device 110.

Camera device 110, Cam and optical output device 120 may be arranged within the interior space 194 of a MRI device 192 (scanner), i.e. within the inner tube or gantry that is surrounded by big coils that generate a high magnetic field during image acquisition using magnetic resonance tomography (MRT). However, camera device 110 generates images/pictures or video data using optical sensors, for instance CCD (Charges Coupled Device) or CMOS (Complementary "metal" oxide semiconductor) sensors arranged in a matrix, i.e. in lines and columns. Camera device 110, Cam and optical output device 120 have to fulfill requirements with regard to MRI shielding and compliance, i.e. they should work properly within high magnetic fields and they should not disturb the MRT. As mentioned in the introductory part of this application above and as explained below with reference to FIGS. 8 to 10 other output units 810b to 810d may be used instead of a camera device 110, Cam, for instance audio devices or modules which detect physiological signals. Optical output device 120 may not be used if no camera module is used, especially not a illumination unit 122. However, a signaling unit 124 of optical output device 120 may be used advantageously also together with output units 810b to 810d that include other units for data/signal collection.

Camera device 110, Cam and optical output device 120 may be removable or removably placed within MRI device 192. A connection segment 170 may connect control unit 130 to camera device 110 and to optical output device 120. Connection segment 170 may comprise flexible cables that form a first connection 172 between control unit 130 and camera device 110 and a second connection 174 between control unit 130 and optical output device 120. However, both connections 172 and 174 may end at camera device 110 if optical output device 120 is integrated within camera device 110.

Optical output device 120 may comprise an illumination unit 122 and a signaling unit 124. Illumination unit 122 may comprise light sources, for instance for white light, or other radiation sources (for instance IR (Infrared) radiation) that radiate electromagnetic radiation 111 into the field of view of the camera device 110 enabling recording of optical images thereby. It is possible to take images/pictures/video streams of the face of the person and/or to take a video stream of the chest, for instance to determine the breathing cycle.

Figure 3:
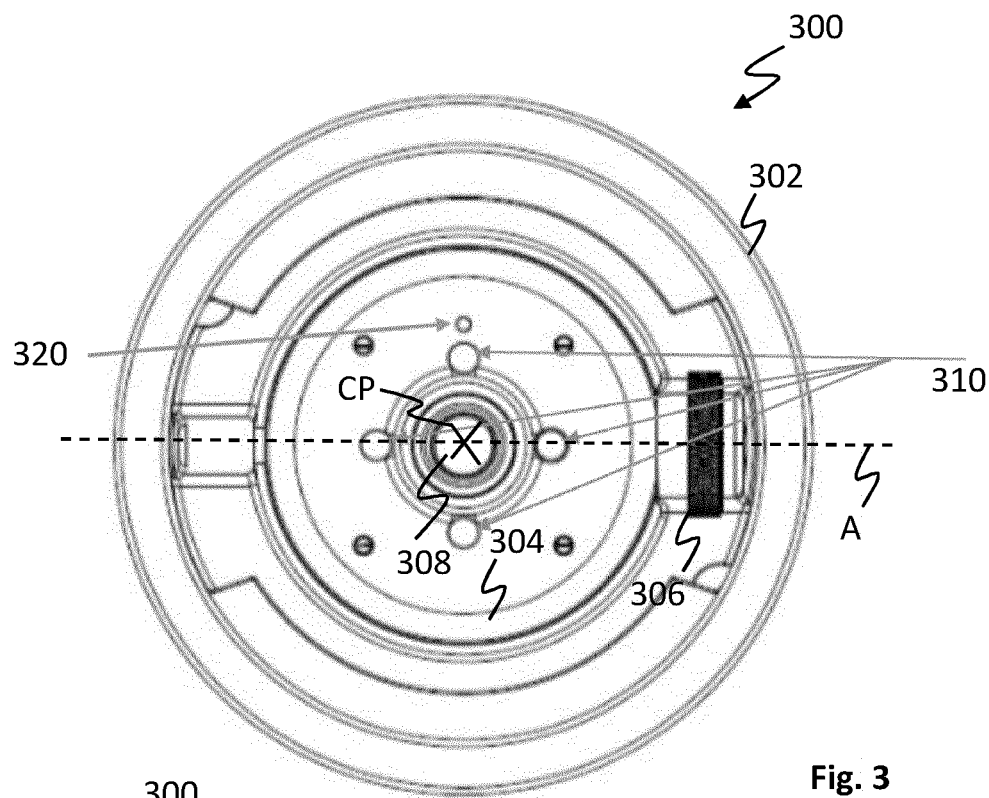

Signaling unit 124 may comprise a light source that generates light that is used for signaling purposes. The light generated by signaling unit 124 may also be directed mainly to the field of view (FOV) of the camera of camera device 110, see signaling light Si1. This may be the case, for instance if the face of the patient is within the focus of the camera of camera device 110. Alternatively, light generated by signaling unit 124 may be directed mainly to a region that is not within the focus of the camera, see signaling light Si2, for instance if the chest of the patient or subject is within the focus but the signaling light has to be seen by the eyes of the patient. One example for the arrangement of camera device 110, illumination unit 122 and a signaling unit 124 is shown in FIG. 3 that is described below.

Control unit 130 may comprise an output unit Mon, for instance a screen, display, a monitor or a touchscreen, for showing the video stream that is generated by camera device 110. Furthermore, control unit 130 may comprise an input device "In" that is used to enter control instructions and/or control data, for instance switching on/off illumination light, switching on/off signaling light, for instance using different colors, selecting video mode of camera (PAL, NTSC), etc. Input device In may also be a touchscreen or other input device.

System 100 may be a system which comprises a recording camera device 110 designed for diagnostics and testing in MRI scanners 192. The use of the camera device 110 may increase the safety of the test subjects or of patients and the effectiveness of MR (magnetic resonance) tests or of MRT. It may allow one to see the patient or subject during MRI and fMRI (functional MRI) tests/imaging and may provide feedback on their activity.

The system may include or comprise a camera device 110, an output device Mon (monitor) and a lighting system 120 mounted for instance in the camera device 110.

The camera of the camera device 110 may allow watching the face or other parts of the patient's or subject's body during the MRI scanning procedure. The camera device 110 may provide feedback about the activity of the patient. The camera device 110 may also allow the patient to be observed by the investigator or, in the case of procedures done with children, by the parents.

An output device Mon (monitor), for instance a touch screen, may be used for viewing the image and setting the lighting parameters. The output device Mon and/or the control device 130 may be mounted on the MRI scanner's 192 housing. The touch screen or another input device "In" may allow the examiner or investigator to adjust some of or all settings of the camera that may be placed inside of the gantry, i.e. within the tube, without leaving the MRI scanning room, making their work easier and more convenient.

Lights may be mounted within the camera housing, see FIG. 3, reference numeral 304. The lights may be operated with the input device "In", for instance with a touch screen.

The lights may allow additional lighting of the face of the patient, for instance using white light. Infrared lighting may be useful in case of studies requiring darkness. Multicolored light signals may enable communication and may significantly simplify conducting a variety of MRI or fMRI (functional MRI) studies or may be used for other purposes.

Figure 2:
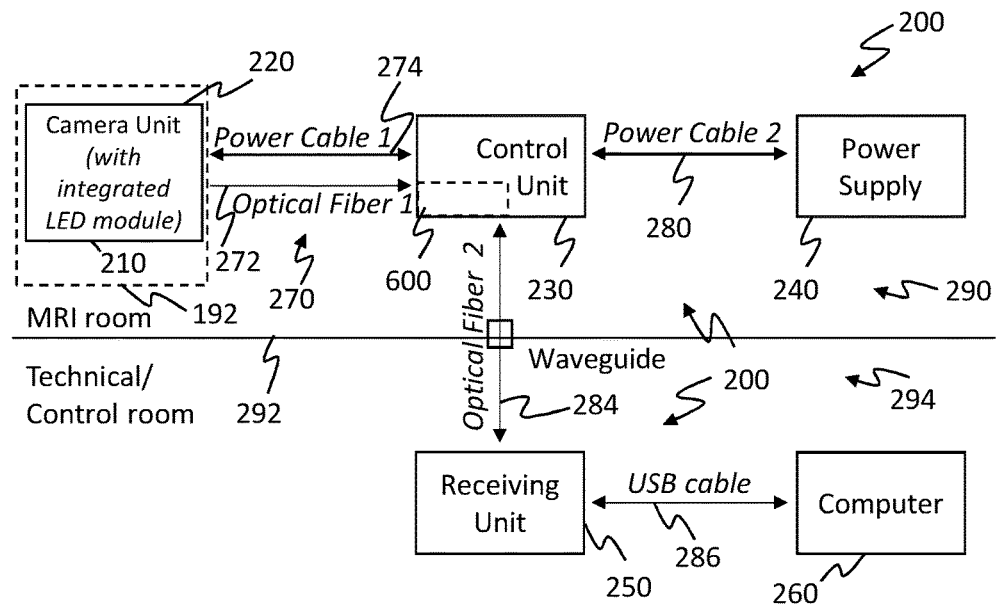

FIG. 2 illustrates the general configuration of the video part and of the control part of a MRI camera system 200 that may comprise more devices compared to system 100. System 200 may comprise:
- a camera device 210 that may corresponds to camera device 110 and that may comprise the same features that are described above, and/or
- an optical output device 220 that may correspond to optical output device 120 and that may comprise the same features that are described above, and/or
- a control unit 230 (display, monitor, touch screen) that may correspond to control unit 130 and that may have the same features that are described above, and/or
- a power supply device 240 that may generate the electrical power for control unit 230 and/or for camera device 210 and/or for optical output unit 210, and/or
- an optional sending and receiving unit 250 or several sending and receiving units 250, and/or
- an optional computing device 260, for instance a computer, preferably a work station computer.

As mentioned in the introductory part of this application above and as explained below with reference to FIGS. 8 to 10 other output units 810b to 810d may be used instead of a camera device 210, Cam, for instance audio devices or modules which detect physiological signals. Optical output device 220 may not be used if no camera module is used, especially not a illumination unit 222. However, a signaling unit 224 of optical output device 220 may be used advantageously also together with output units 810b to 810d that include other units for data/signal collection.

Furthermore, more than one sending and receiving unit 250 may be used for output units comprising a camera or for output units comprising other data generation or data collection units than a camera.

Sending and receiving unit 250 may be a separate unit or may be part of computing device 260, i.e. using the same internal power supply unit, being arranged within the same housing etc.

There may be the following connections within system 200:
- a connection segment 270 between control unit 230 and optical output device/camera device 220. Connection segment 270 may correspond to connection segment 170 (see features mentioned above) and may comprise an optical connection 272 (may correspond to 172) and a power line connection 274 (may correspond to 174), for instance via an electrical cable or line, and/or
- a power line connection 280 that delivers electrical current and electrical voltage from power supply 240 to control unit 230, for instance an electrical conductive cable or line, and/or
- an optional optical connection 284 between control unit 230 and sending and receiving unit 250, and/or
- an optional connection 286 or a wireless connection between sending and receiving unit 250 and computer 260, for instance a USB (Universal Serial Bus) connection.

A splitting unit 600 may be comprised within control unit 230. The components of the splitting unit 600 are described below in connection with the description of FIG. 7 in more detail. Splitting unit 600 may play a central part in forwarding data within system 200.

An MRI device room 290 may comprise: MRI device 192, optical output unit 210 (arranged within interior space that is surrounded by MRI device 192), camera device 220 (arranged within interior space that is surrounded by MRI device 192) and power supply device 240. Optical output unit 210, camera device 220 and power supply device 240 may be MRI shielded/protected in order to guarantee proper operation during MRT imaging process and in order to prevent artefacts within the MRT image due to the operation of these devices.

Alternatively, power supply device 240 may be located outside MRI device room 290. For safety reasons the power supply device 240 may be able to detect a magnetic field strength above 20 mT (milli Tesla). After the detection of a high density magnetic field the power supply device 240 may cut off power supply to the system and may indicate danger, for instance by emitting red light. Furthermore, all power lines may comprise additional filtering.

A wall 292 separates MRI device room 290 from a control room 294. Wall 292 may have special shielding, for instance magnetic shielding or EMC (Electro Magnetic Compatibility). Alternatively or additionally, wall 292 may have an appropriate thickness and/or material, for instance armored concrete. Control room 294 comprises sending and receiving unit 250 and computing device 260 and/or optionally power supply device 240. This also means that sending and receiving unit 250 and computing device 260 and/or power supply device 240 in control room 294 do not have to fulfill special requirements with regard to MRI shielding/protection.

Thus a communication between a touch screen unit or control unit 230, a receiver unit (sending and receiving unit 250) and a camera device 210 is described. Control unit 230 and sending and receiving unit 250 may allow controlling some or all camera setting options of the camera within camera device 210 and receiving video signals. All control signals and/or video signals may pass through touch screen unit, i.e. through control unit 230. Thus, control and monitoring of image/video data may be possible from control unit 230 and from computing device 260. Alternatively, it may only be possible to enter control data using control unit 230 or computing device 260. Furthermore, it is possible to operate the light sources of optical output device 120, 220 using control unit 230 and/or computing device 260, for instance for communication with the person or patient who is examined within MRI device room 290, i.e. sending signals to this person.

FIG. 3 illustrates a frame head 300 for carrying parts of system 100 or 200 including for instance only one multicolor optical signal device (for instance RGB (Red Green Blue) LED (Light Emitting Diode), at least one multicolor optical signal device, only one signal device (for instance red LED, green LED or blue LED) or a plurality of signal devices (for instance several LEDs of a different or of the same color).

Frame head 300 may comprise:
- an outer ring 302,
- a housing 304,
- an optional operating element 306,
- a camera 308 of camera device 110, 210,
- at least one illuminating device 310, i.e. one, two, three, four or more than four, and
- only one or at least one signaling device 320, i.e. one, two, three, four or more than four.

Outer ring 302 may have a circular or elliptical shape. Outer ring 302 may be used to mount and hold housing 304 relative to an arm of a frame that comprises frame head 300, see also FIG. 4.

Housing 304 may comprise camera device 110, 210 or 810b to 810 (if realized as camera) and optical output unit 120, 220. Housing 304 may have a disc shape or a disc like shape. There may be only a narrow gap between outer ring 302 and housing 304 enabling a good protection of the housing, especially of the breakable camera 308 against mechanical impact.

Operating element 306 may be mounted to housing 304, i.e. if operating element 306 is rotated or turned, housing 304 pivots or rotates around an axis A with regard to outer ring 302. Housing 304 may be tilted relative to outer ring 302, see FIG. 4. This movement may allow proper positioning of camera 308 and/or of illuminating lights and/or of signaling light(s). Operating element 306 may be an engrailed disc in order to ease operation thereof.

Camera 308 may be part of camera device 110, 210. Camera 308 may allow use of several interchangeable photographic objectives or lenses of different angels of view and/or of different focal lengths. Alternatively only one lens may be used. An aperture of camera 308 may be located on a central axis of housing 304 that may be arranged coaxially with outer ring 302 if both parts are within the same plane.

In the example, there are four illuminating devices 310 that may be part of illuminating unit 122 or of a corresponding illuminating unit of optical output device 220. Preferably, optoelectronic devices are used as illuminating devices 310, for instance LEDs. It is possible to use LEDs that radiate white light and/or LEDs that emit IR (infrared) radiation. Alternatively, other types of illuminating devices may be used, for instance lamps with or without a filament.

Four illuminating LED modules 310 may be used in the example that is shown in FIG. 3. Each illuminating LED module may comprise or contain one white LED and one IR LED. Alternatively, only one of these LEDs may be used in each module, for instance only white LEDs, only IR LEDs or some module(s) only with white LED(s) and other module(s) only with IR LED(s).

In the example shown in FIG. 3 only one signaling device 320 is used. Signaling device 320 may be part of signaling unit 124 or of a corresponding signaling unit of optical output device 220. Preferably, optoelectronic devices are used as illuminating devices 320, for instance LEDs. It is possible to use LEDs that radiate white light, colored light of a single wavelength or narrow wavelength band (less than for instance 50 nm), or that radiate multicolored light (for instance two, three or more than three small narrow wavelength band, each less than for instance 50 nm). RGB LEDs or multicolor LEDs may be used to radiate multicolor light, i.e. a mix of several colors. Alternatively, other types of signaling devices may be used, for instance lamps with or without a filament or rotating disks carrying areas of different colors. Only one color area may be visible through an aperture if the disc is in its corresponding angular position. The rotating disk may be illuminated directly or indirectly.

The RGB LEDs may be driven by a PWM (Pulse Width Modulated) controlled current source, preferably by a voltage controlled current source. This is explained in more detail with regard to FIG. 5 below. Alternatively, it is possible to use digital analog converters (DAC) of a microprocessor or separate DACs to control the current source. Other examples may comprise more than one RGB LED module or single LEDs of different colors.

In the example shown in FIG. 3, there is the following arrangement of elements:
  the aperture of camera 308 of camera device 110, 210 is arranged centrally within housing 304 wherein a center point CP is arranged in the center of the aperture/lens of the camera 308 (optical axis),
  illuminating devices 310 are arranged at a radius R1 from center point CP and neighboring illuminating devices 310 may have the same distance especially the same angular distance. This may also be valid if less than four or more than four illumination devices are used.
  signaling device 320 is arranged at a radius R2 from center point CP. Radius R2 may be greater than radius R1, for instance by at least 10 percent of radius R1. Furthermore, the radiation characteristic of signaling device 320 that is comprised in signaling unit 124 or a corresponding unit of optical output device 220 may be adapted to radiate away from illuminating devices 310 in order to ease recognition of the signaling by the subject or patient.

Housing 304 may comprise further parts, for instance screws for holding two or more parts of housing 304 together, or parts that are placed on the rear side that is not visible in FIG. 3.

Figure 4:
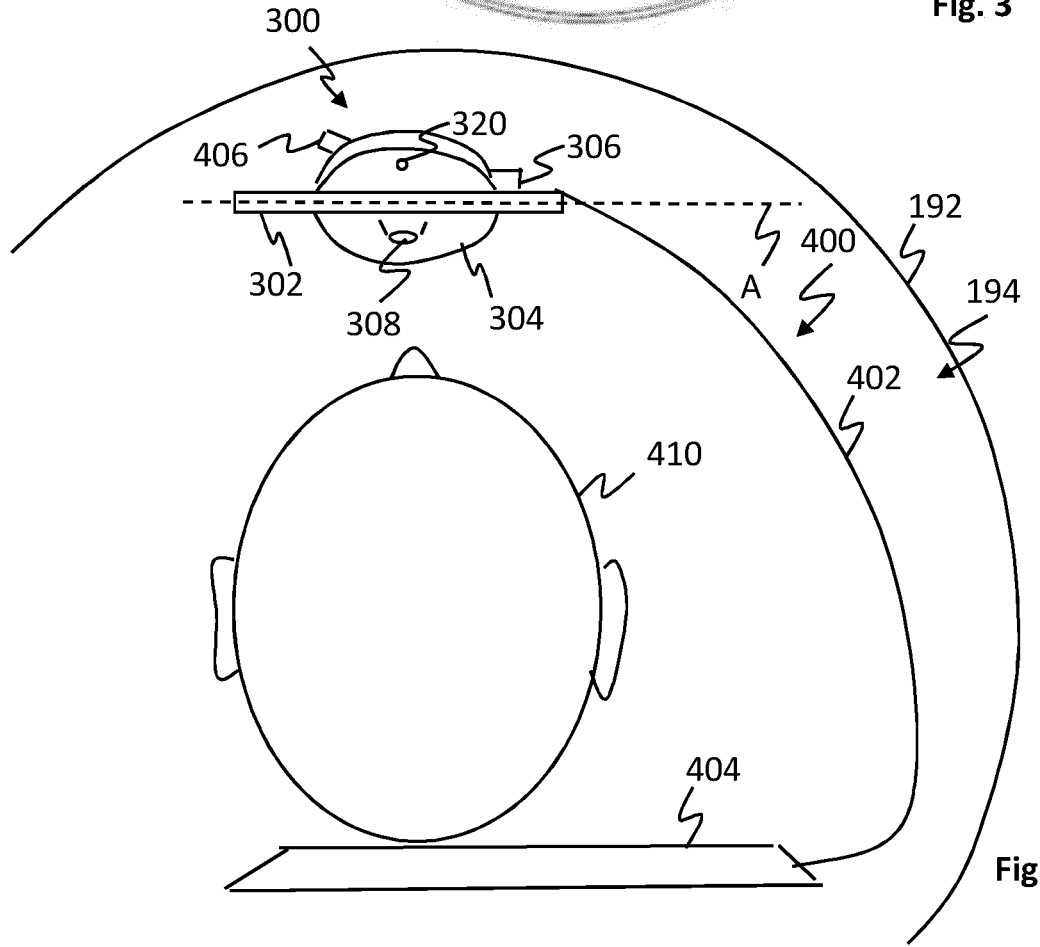

FIG. 4 illustrates a frame 400 that forms a holder device for housing 304. Frame 400 comprises:
  frame head 300,
  an arm 402, and
  a foot plate 404 that forms a base.

A connection port 406 may be arranged onto housing 304. Connection port 406 may be used to connect optical connection 172 or 272 to housing 304. Furthermore, connection port 406 may be used to connect power cable 174 or 274 to housing 304. Optical connection 172, 272 and power connection 174, 274 may be combined into one physical cable. Connection port 406 may then comprise optical connection and electrical connection. Power cable 174, 274 and optical connection 172, 272 may be connected to housing 304 in various ways, for instance using arm 402 or parts of arm 402 for guiding the cable 174, 274.

An inner tube of MRI device 192 is also shown in FIG. 4. Furthermore, the head 410 of a person or patient is shown. The inner tube surrounds interior space 194. Head 410 is placed within interior space 194. Arm 402 of frame 400 may be curved and may be adapted to the shape of the head 410 and/or to the shape of inner tube of MRI device 192. Head 410 may be placed on foot plate 404 of frame 400 thereby also fixing frame 400 to a bed on which the patient lies. There may be no further mounting means for mounting frame 400 to the bed. Alternatively, further mounting/fixation means may be used, for instance clamping devices. Additional components of frame 400 should not be ferromagnetic nor conductive.

Signaling device 320 may be located nearer to the eyes of the patient than illuminating devices 310 in order to ease recognition of the signaling. The nose of the patient is nearer to the head 300 of frame 400 than the back of head 410 of the patient, i.e. the back of head 410 rests on foot plate 404. Foot plate 410 of frame 400 may be upholstered. The distance between head 300 of frame 400 and foot plate 404 may be in the range of 30 cm (centimeters) to 50 cm.

Figure 5:
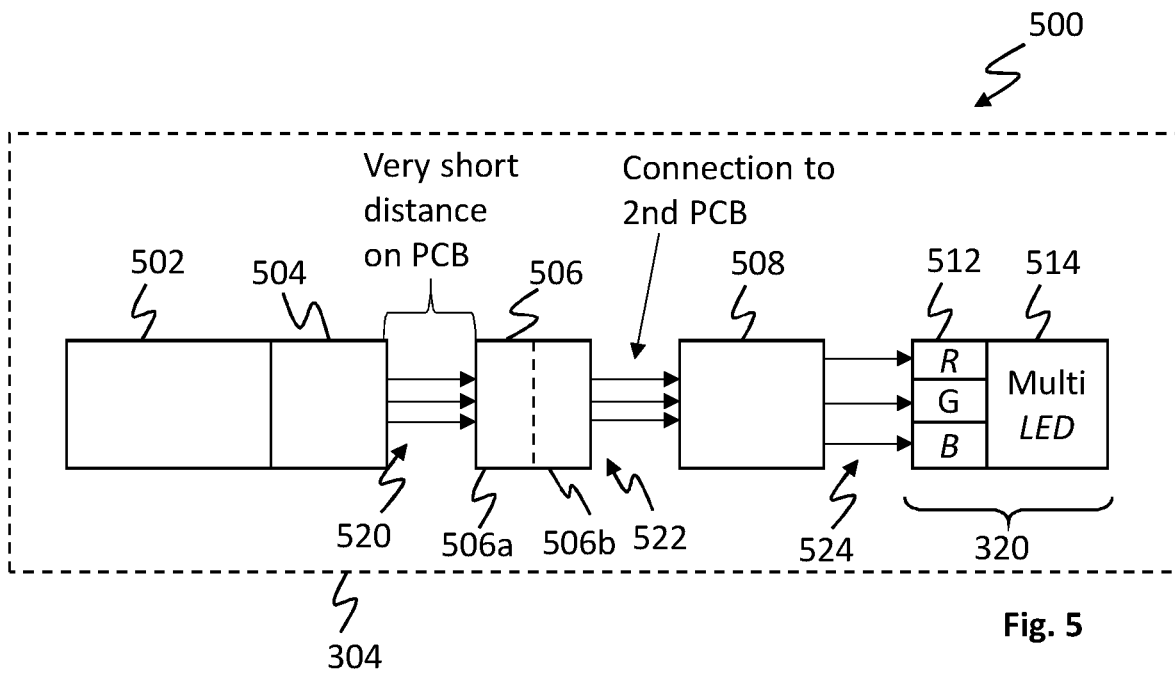

FIG. 5 illustrates a control circuitry 500 for the RGB LED module 320. Control circuitry 500 may be used to control signaling device 320 and may comprise:
  a processor 502,
  an optional PWM (pulse width modulation) circuit 504,
  a low pass filter unit 506, a current source circuit 508,
and signaling device 320.

A serial connection of only one PWM circuit 504, of only one low pass filter unit 506, of only one current source circuit 508 and of only one LED may be used to control this LED. Thus, the number of PWM circuits 504, of low pass filter units 506 and of current source circuits 508 depends on the numbers of LEDs that have to be controlled. Different PWM duty cycles may be used for each one of the LEDs. In the example that is shown in FIG. 5 three LEDs are comprised within signaling device 320. However, in the following only one serial connection of only one PWM circuit 504, of only one low pass filter unit 506, of only one current source circuit 508 are described for the red R LED of signaling device 320. There are corresponding serial connections for the green G LED and for the blue B LED of signaling device 320. Thus, there may be three independent PWM circuits 504, three independent low pass filter units 506 and three current source circuits 508.

There may be the following connections:
an electrical connection 520 between an output of the PWM circuit 504 and an input of low pass filter unit 506,
an electrical connection 522 between an output of low pass filter unit 506 and an input of current source circuit 506, and
an electrical connection 524 between an output of current source circuit 508 and an input port 512 of the red R LED on signaling device 320.

Microprocessor 502, PWM circuit(s) 504 and low pass filter unit(s) may be arranged on a first PCB (printed circuit board). Current source circuit(s) 508 and signaling device 320 may be arranged on a second PCB. Connection 520 may be made as short as possible in order to reduce electromagnetic radiation therefrom. Connection 520 may be shorter than 20 mm (millimeters) or shorter than 10 mm or shorter than 5 mm or even shorter than 3 mm, for instance about 2.1 mm. Connection 522 between the first PCB and the second PCB may also be as short as possible, for instance less than 20 mm, less than 10 mm or less than 7 mm, for instance 6 mm or about 6 mm. However, length of connection 524 also should be as short as possible, however it is additionally protected using low pass filter unit 506.

Processor 502 may be a standalone processor or a processor that is part of a microcontroller. The processor may execute instructions of a program. Alternatively, a state machine (FPGA (Field Programmable Gate Array), PLD (Programmable Logic Device), CPLD (Complex PLD), etc.) without a processor that executes instructions of a program may be used.

PWM circuit 504 may realize a periodical on/off switching of a signal. The ratio between on time (duty cycle) and off time may be selected appropriately depending on a data value that specifies the brightness of the red R LED. By using a PWM signal, it is possible to use only two voltage levels which is appropriate for signal transmission in complex environments (for instance with strong electromagnetic interferences). The transmission of only two voltage levels or electrical potentials is more reliable than transmission of a voltage value that may be within a continuous range. Furthermore, switching mode of transistors requires lower power than continuous operation.

The PWM signal may be generated from analog signals (for instance using a raising signal (saw tooth signal or triangle signal) and a comparator. Alternatively, the PWM signal may be generated from digital signals. It may be possible to use DAC (Digital to Analog Converter) units of a microcontroller to control LEDs directly, i.e. without using separate PWM circuits. However, these units may be used already for the illumination device 324. Thus, separate PWM circuits may be used for signaling device 320.

The frequency of the PWM may have various values, e.g. to be in the range of 80 to 150 Hertz. The PWM signal is filtered with analogue filters 506 that are adjusted to the PWM frequency. Thus LEDs are driven with a continuous electrical signal that does not introduce artifacts to MRI environment. Changes in PWM parameters will be reflected in the brightness of LEDs.

Low pass filter unit 506 may comprise only one low pass filter to prevent abrupt changes of current flow which may lead to MRI artefacts. Alternatively, low pass filter unit 506 may comprise more than one filter unit, i.e. two filter units or more than two filter units that are connected serially. Low pass filter unit 506 may comprise a first low pass filter unit 506a and a second low pass filter unit 506b that receives the output signals of the first low pass filter unit 506a. The cut off frequency of the first low pass filter unit 506, for instance 159 Hertz may be higher than the cutoff frequency of the second low pass filter unit 506, for instance 146 Hertz.

Usually, low pass filtering may not be used for controlling LEDs because color of radiation and degree of efficiency of the LED may depend on the amount of current. Furthermore, the light intensity of the LED depends in a strongly nonlinear way on operation current. However, reducing MRI interference may be a reason to use a low pass filter unit, especially in combination with a current source that is voltage controlled, i.e. there are already comparably low currents.

Current source circuit 508 may be based on an OP-Amp (Operational Amplifier). Preferably, a voltage controlled amplifier may be used in order to reduce MRI artefacts because only small currents are necessary in order to perform control of the current source circuit 508. Current source circuit 508 outputs a current that depends on the input voltage. Voltage controlled current sources are known for instance from Tietze U. and Schenk, Ch., "Halbleiter-Schaltungstechnik", 10th edition, Springer, 1993, page 367 to page 378.

Signaling device 320 may comprise or consist of a multi LED 512 that is within an integrated circuit (IC). Signaling device 320 may comprise an input port 512 for each LED of the multi LED 514, i.e. there may be three input ports 512. At least one further port may be used for power supply.

Processor 502 may be a processor that is appropriate for operation within an MRI device 192, i.e. a low power processor or a low power microprocessor or a low power microcontroller. Additionally or alternatively, processor 502 may be shielded using metal.

Thus, filter units 506 and current source circuits 508 may be implemented in order to avoid abrupt changes on current flow that may lead to MRI artifacts. Filter units 506 may be located in a very short distance to PWM outputs to avoid longer lines that may cause MRI artifacts. Current source circuit 508 may be voltage-controlled, based on an Op-Amp that has high input impedance to minimize current flow. Brass shielded electronic circuits may be used for MRI protection.

In general the following measures may be used for MRI protection:
current-source controlled LEDs,
(micro-)processor and/or control circuits and/or transmission circuits and/or camera matrix may be shielded, especially metal shielded, e.g. brass or copper shielded, low-power (micro-)processors may be used for low current flows, data transmission may be realized through optical fibers or electric control lines with additional resistors. The resistors may be combined with capacitance of the circuits in order to create RC (Resistor Capacitance) filters which may be empirically adjusted or which may be adjusted based on simulations.

filtering on power lines may be used.

Figure 6:
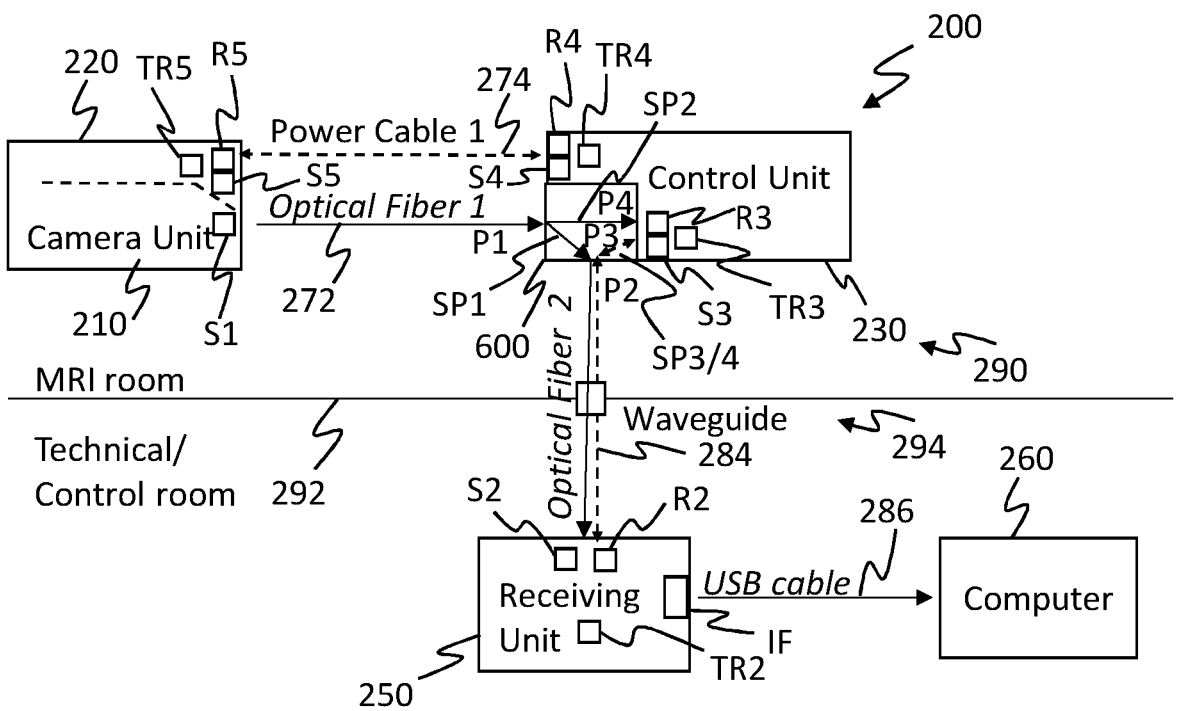

FIG. 6 illustrates a video signal transmission part and a control signal transmission part of the MRI camera system 200. Video signal transmission is illustrated by continuous lines. Control signal transmission is illustrated by dashed lines.

For the video output the following applies:

the video signal is created in camera device 210 and is sent from optical sending unit S1 through optical connection 272, for instance an optical fiber, to control unit 230 (touch screen unit), especially to a port P1 of splitting unit 600, within splitting unit 600 of control unit 230 the video signal is split into two signal paths SP1 and SP2. Signal path SP1 is connected with a port P2 of splitting unit 600. Port P2 is connected with optical connection 284 that guides optical waves to an optical receiver R2 within sending and receiving unit 250. Signal path SP2 is connected with a port P4 of splitting unit 600. Port P4 is connected with an optical receiver unit R3.

control unit 250 processes the video signal and allows to view the image on output device Mon, the video signal goes through optical connection 284 (fiber) to sending and receiving unit 250 that is located in technical/control room 294, the video signal is processed in sending and receiving unit 250 and is sent to computing device 260 (PC (Personal Computer)) or to another device (frame grabber, monitor, display) that may comprise a recording device and/or a viewing device.

Control signals (see dashed lines) can be managed either by control unit 230, for instance using a touch screen, or by sending and receiving unit 250 and/or computing device 260. If control is performed by sending and receiving unit 250 and/or computing device 260 the control signal goes through control unit 230. This way camera device 210 and/or optical output device 220 always receive control signals from control unit 230, for instance from touch screen unit.

Between sending and receiving unit 250 and control unit 230 the control signal is transmitted from an optical sending unit S2 through optical connection 284 (fiber) (the same connection 284 may transfer video signals) to port P2 of splitting unit 600. Within splitting unit 600, there is a signal path SP3 from port P2 to port P4 of the splitting unit. Port P4 is connected with optical receiving unit R3 of control unit 230. Between control unit 230 and sending and receiving unit 250 the control signal is transmitted from a sending unit S3 that is connected with a port P3 of the splitting unit through a signal path SP4 within splitting unit 600 to port P2 of the splitting unit 600 and further via optical connection 284. The signal paths SP1 to SP4 are shown in more detail in FIG. 7.

Between control unit 230 (touch screen unit) and camera device 210 and/or optical output device 220 control signals are transmitted through power line connection 274. An electrical sending unit S4 of control unit 230 is connected to power line connection 274 as well as an electrical receiver unit R4 of control unit 230. Furthermore, an electrical sending unit S5 of combined camera device 210 and/or optical output device 220 is connected to power line connection 274 as well as an electrical receiver unit R5 of combined camera device 210 and/or optical output device 220. It is possible to use separate sending units and receiving units for camera device 210 and for optical output device 220, all of them connected to power line connection 274.

The control signals may be unidirectional from control unit 230 to combined camera device 210 and/or optical output device 220, i.e. on power line connection 274. Alternatively control signals may be bidirectional on power line connection 274, for instance using acknowledgement commands and/or sending status data to control unit 230. Control signals may be unidirectional from sending and receiving unit 250 and/or computing device 260 to control unit 230 and then further to combined camera device 210 and/or optical output device 220. Alternatively control signals may be bidirectionally transmitted on optical connection 284, for instance for acknowledgment or for sending status data.

Splitting unit 600 may be an integral part of control unit 230, i.e. contained within the same housing, or splitting unit 600 may be separate from control unit 230. Alternatively, splitting unit 600 may be a separate part from control unit 230.

Transceiver units may be coupled to respective pairs of sending units and receiving units, e.g.:

a transceiver unit TR2 to sending unit S2 and to receiver unit R2, a transceiver unit TR3 to sending unit S3 and to receiver unit R3, a transceiver unit TR4 to sending unit S4 and to receiver unit R4, and a transceiver unit TR5 to sending unit S5 and to receiver unit R5.

Communication of Control Signals Over Power Line Connection 274

Camera device 110, 210 as well as 810b to 8110d (if implemented as camera) and/or optical output unit 220 may be controlled over power supply, i.e. via power line connection 274 by the control unit 230 (touch screen unit). This may be a bidirectional communication. The following rules may apply:

One of the devices (control unit 230/Touch Screen Unit) is the master unit and the other one (camera device 210/optical output device 220) is the subordinated unit (slave).

the master may provide voltage signal for powering and communication of the slave via the power line connection 274, the voltage signal of the master may comprise of constant voltage (DC, direct current/voltage) component for power supply and an alternating voltage component for communication of control signals, the slave may record changes of the alternating voltage component to read the information of the control signal, the slave may control electric load of the power line which influences current flow through the line, the master may measure the current flow on the power line which allows to read control information sent by the slave.

However, other modes of communication of control signals on power line connection may be used as well. It is also possible to transmit control signals via optical connection 272 between combined camera device 210 and/or optical output device 220 and control unit 230. There may be only one receiving unit and only one sending unit on the side of combined camera device 210 and/or optical output device 220. Control data is collected and distributed appropriately between camera device 210 and optical output device 220. However, it is also possible to use separate receiving units and sending units for camera device 210 and optical output device 220 for control signaling on power line connection 274. An addressing method may be used in this case. A further alternative is to use two separate power line connections.

A detection circuit of the current within the master unit or of the voltage within the slave unit may be preceded by RC (Resistor Capacitor) filtering which may exclude the DC (direct current/voltage) value from the line.

In order to minimize artifacts, noise and power consumption, the coding of the signal may be designed so that the mean value of the alternating voltage and current component is equal to 0. The bit rate of the communication may be in the range of 0.1 bit/ms to 10 bits/ms, for instance 1 bit/1 ms (millisecond).

Each control command may comprise or consist of:
command information,
frame format information,
cyclic redundancy check CRC, and
forward error correction FEC.

Coding:

Frequency-Shift Keying (FSK) may be used on power line connection 274 to meet the requirements. This coding may utilize discrete frequency changes of carrier signal. Frequency lower than nominal frequency may be called '0' and frequency higher than nominal frequency may be '1'. There may be a third state, cs', that relates to no signal and marks the beginning of the frame, and that is also used on the transmission line while no information is transferred. The third state may be a state with simply no changes of voltage and/or current flow—thus a constant power supply voltage and/or constant load may be there.

Each single information time slot may be marked by at least 5 periods of '0' signal or by 10 periods of '1' signal.

The shortest frame may be defined as: s010xxxxxxxx and may comprise or consist of:
at least 12 slots, consecutively:
's'—marks the beginning of the frame,
'010'—allows for preparation of the receiver, i.e. defining width of each symbol, other preambles may be used as well;
8 or more bits with the command information, for instance in LSB (least significant bit) first sequence.

The shortest frame may take 18 time slots. The shortest frame may be elongated by adding more bits with information, ex. up to 256 bits (i.e. 32 B (Byte)).

Command information may be followed by 1 B (Byte) of check sum.

The shortest frame may take no longer than 20 ms (milliseconds), thus 1 time slot should take 1.111 ms (milliseconds). This may require that the frequency of '0' is at least 4.5 kHz (Kilohertz) (f0) and the frequency of '1' may be 9 kHz (f1).

To meet requirements of implementing the coding on microprocessor with MCU frequency of for instance 32 MHz (MCLK), the following parameters may be set:
f1=10 kHz,
f0=5 kHz (or higher, but lower than f1),
tslot=1 ms, and
shortest frame period of 18 ms.

However, other clock frequencies may also be used. If other clock frequencies are used there may be corresponding changes with regard to the overall timing.

Sampling frequency (Fsmp) of Analog-to-Digital Converter (ADC) should or may not be lower than 2×10 kHz (Kilohertz). However to allow oversampling sampling frequency Fsmp may be equal to 40 kHz, which may fit the requirements of the microprocessor or of other computing devices.

Communication of Video Signals and of Control Signals Over Optical Fiber

To provide best performance and easy to use setup in MRI (Magnetic Resonance Imaging) environment, sending and receiving unit 250 should or may send and receive control signals to/from control unit 230 (for instance comprising a touch screen) through optical connection 284 (fiber), i.e. passing through an electromagnetic waveguide for light. To avoid using multiple optical fibers, a single optical fiber may be used for either transmitting video signal and control signals. Splitting unit 600 located within control unit 230 (touch screen) may combine signals coming from video output and control signals. Optical signals may be transmitted through transmission channels that operate using for instance transmitters HFBR-1414MZ of Broadcom® and receivers HFBR-2416TZ Broadcom®. However, other devices of Broadcom® or of other companies may also be used. These electronic circuits allow a nominal bandwidth of up to 125 MHz (Megahertz). Video signals may use a bandwidth of up to 60 MHz (Megahertz). This may leave higher frequencies unoccupied and suitable to use them for control signal transmission. In order to simplify design, it was proposed that wide bandwidth radio transmitters or transceivers (for example using frequencies of 80 MHz and higher, ex. ADF7020-1BCPZ of Analog Devices®, or corresponding devices of other companies) may be used to control transmission channels for control signals and/or for video signals.

It should be noted that MRI scanners may use radio frequencies for their operation and this may lead to noise during the operation of the system. 1.5 T (Tesla) MRI scanners may use frequencies of about 64 MHz while 3 T MRI scanners may operate with radio frequencies of about 128 MHZ (for instance 127.734 MHz).

To avoid any artifacts, it could be necessary to use frequencies above this value, so clearly over the 125 MHz bandwidth of optical channels. It may be highly recommended to avoid of using any signal near MRI work frequency and signals which multiples are near MRI work or operation frequency.

Radio frequency transmitters however have the advantage of being able to operate at low signal-to-noise ratio and have very high dynamic range. We verified that the system consisting of radio transmitter and optical channels may work or operate properly even without matching to transmission line's characteristic, i.e. electrical and/or optical, provided that the system consists of separate receive RX and transmit TX lines of radio transmitter (transceiver) and that radio transceiver is for instance voltage controlled. The transceiver circuits may be voltage controlled by a microprocessor, for instance using TTL (Transistor-Transistor Logic) technology. Current control may be used only for some components of the system, especially for some other components than the transceiver, in order to control current changes more precisely. Minimal dynamics of transmission line must be or should be about 80 dB (Decibel). Radio transceivers may allow to couple for instance analog video signal or digital video signals with digital control signals in one fiber without both signals degradation. Alternatively, a multi-fiber connection may be used. However, more fibers may complicate the connection between control unit 130, 230 (Touch Screen Unit) and receiver unit 250.

Figure 7:
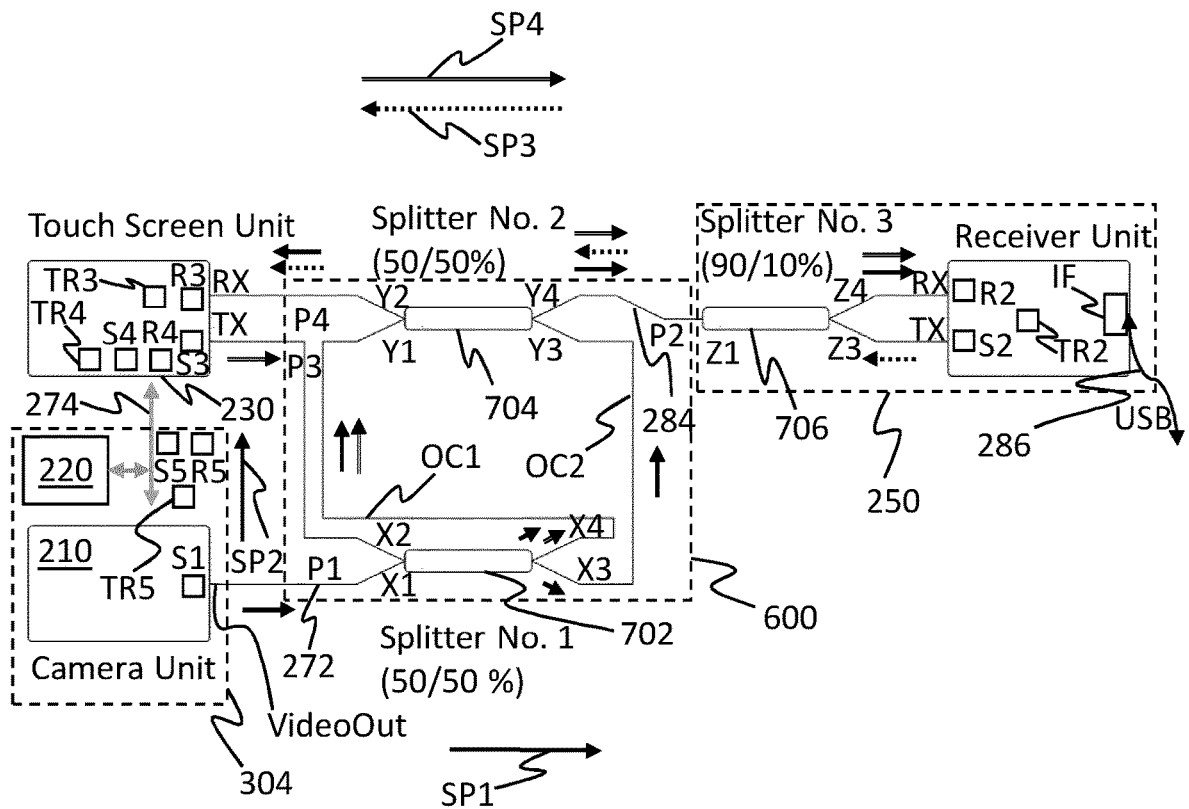

FIG. 7 illustrates splitting unit 600 in more detail. Splitting unit 600 may comprise:
a splitting member 702 (coupler),
a splitting member 704 (coupler),
internal optical connection OC1, and
internal optical connection OC2.

Splitting member 702 (coupler) may be a 50% (percent)/50% split ratio coupler. Other ratios are also possible. Splitting member 702 may have four ports X1 to X4. Ports X1 and X2 are on one end of splitting member 702 and ports X3, X4 are on the other end of splitting member 702. Splitting member 702 may be a bidirectional coupler, i.e. either end may be used as an input and the respective other end is the output. An input signal at one port (for instance port X1) at one end is transmitted to the ports (X3, X4) at the other ends, whereby the optical power is reduced to 50 percent on both output ports if compared with the power on the input port.

Splitting member 704 (coupler) may also be a 50%/50% split ratio coupler. Other ratios are also possible. Splitting member 704 may have four ports Y1 to Y4. Ports Y1 and Y2 are on one end of splitting member 704 and ports Y3, Y4 are on the other end of splitting member 704. Splitting member 704 may be a bidirectional coupler, i.e. either end may be used as an input and the respective other end is the output. An input signal at one port (for instance port Y1) at one end is transmitted to the ports (Y3, Y4) at the other ends, whereby the optical power is reduced to 50 percent on both output ports if compared with the power on the input port.

Receiving and sending unit 250 may comprise a further splitting member 706, for instance a 90%/10% split ratio coupler. Other ratios are also possible for instance 75%/25%. Splitting member 706 may have three ports Z1, Z3 and Z4. Port Z1 is on one end of splitting member 706 and ports Z3, Z4 are on the other end of splitting member 702. Splitting member 702 may be a bidirectional coupler, i.e. either end may be used as an input and the respective other end is the output. An input signal at one port (for instance port Z1) on one end is transmitted to the ports (Z3, Z4) at the other ends, whereby the optical power is reduced to 90 percent on one output port Z4 and to 10 percent on the other output port Z3 if compared with the power on the input port. Port Z4 may forward the signal to optical receiver unit R2 of the receiving and sending unit 250. Port Z3 is connected to optical sending unit S2 and transmits the signal. There may be no signal power loss in this direction, i.e. from port Z4 to port Z1 and/or from port Z3 to port Z1.

All splitting members 702 to 706 may be splitting members of THORLABS® Inc., see www.thorlabs.com, for instance 50:50 wideband fiber coupler or 90:10 wideband coupler. However, splitting members or other types and/or produced by other companies may also be used.

Internal optical connection OC1 may be coupled to port X4 of splitting member 702 and to port Y1 of splitting member 704. Internal optical connection OC2 may be coupled to port X3 of splitting member 702 and to port Y3 of splitting member 704.

Port P1 of splitting unit 600 may be connected to port X1 of splitting member 702. Port P3 of splitting unit 600 may be connected to port X2 of splitting member 702. Port P4 of splitting unit 600 may be connected to port Y2 of splitting member 704. Finally, port P2 of splitting unit 600 may be connected to port Y4 of splitting member 704.

Signal path SP1 may be directed from port P1, via splitting member 702, optical connection OC1 and splitting member 704 to port P2. Signal path SP2 may be directed from port P1, via splitting member 702, optical connection OC2 and splitting member 704 to port P4. Signal path SP3 may be directed from port P2 of splitting unit 600, via splitting member 704 to port P4. Signal path SP4 may be directed from port P3, via splitting member 702, optical connection OC1 and splitting member 704 to port P2.

Port Z1 of splitting member 706 may be connected with optical connection 284. Port Z3 of splitting member 706 may be connected with sending unit S2 within sending and receiving unit 250. Port Z3 of splitting member 706 may be connected with receiving unit R2 of unit 250. Splitting member 706 may be an integral part of unit 250 or may be a separate part thereof.

Sending and receiving unit 250 may comprise a forwarding unit FWU that may be connected to an output and/or to an input (node) of the transceiver unit TR2 and that may be connected to an output node of a video signal or video data receiving unit and/or that may be connected to the at least one interface unit IF. The forwarding unit FWU may be configured to forward the video signal or the video data to the interface unit IF or to another interface (for instance to an HDMI) and to forward control data that is received using the transceiver unit TR2 to the interface unit IF. The forwarding unit FWU may be configured to forward control data that is received using the interface unit IF to an input of the transceiver unit TR2.

Spoken with other words, a MRI (Magnetic Resonance Imaging) camera device 310 and/or signaling (communication) device 320 are disclosed:

1) The signaling (communication) device 320 may be based on multi colored light signals operating in MRI environment.

2) An integrated system 100, 200 consisting of or comprising the communication device according to 1) and/or an MRI compatible camera device 310, controlled by an MRI compatible control unit (230) comprising for instance a touchscreen and/or by a central control unit, for instance by a computing device (computer) in a technical room 294.

The communication and experiment control system may be dedicated to the use in an MRI environment. A system is disclosed that may allow performing novel methods of communication with a patient (subject) or other person (subject) during MRI and, especially, fMRI (functional MRI) procedures, as well as experiment control. An MRI environment may be challenging for electronic devices. Hence only a few solutions are offered on the market. Many clinical and research procedures may require the subject to perform specific tasks at a precisely defined time. The challenge is to provide the subject with information on e.g. when to start the task or when to stay still, i.e. not to make any movement. It may also be important to be able to verify if the subject performs the task in a correct manner. This may help to reduce the number of unsuccessful trials and, thus, reduce costs and time required for diagnostic or investigation process.

Another factor may be providing safety to the patient—MRI environment is stress-inducing, especially for people with for instance claustrophobia. MRI procedures are also often performed on patients in poor health condition, with likelihood of conditions such as seizures, arrhythmia or loss of consciousness. Thus it is important to monitor patients' state during the procedure and to be able to react to unpredictable situations.

Many MRI scanners 192 available on the market are not equipped with accessories that allow for the above stated monitoring.

The proposed solution may also be extended by an audio-based communications system. Audio-based communication systems provide a natural way of communication with the patient. The optical output device 320 may allow providing good synchronization for time-sensitive tasks. Camera device 310 may offer flexibility and may allow monitoring key parts of the subject's body, e.g. face or fingers.

An object of the disclosure is to provide an integrated system 100 to 1000 that allows inter alia for time-precise visual presentation of information to the subject and/or visual control of the subject's performance for a variety of procedures. Another key factor may be to allow easy and flexible control over the proposed functionality.

The object may be achieved using a system 100 to 1000 consisting of or comprising the at least two or all of the following features:

1) A communication interface (optical output device 120, 220) equipped with multicolored lights 320, used as communication signals. The interface (optical output device 120, 220) may be designed to be compatible with MRI device 192. This means that it is resistant to high magnetic fields and does not induce any artifacts to MRI image while operating inside the gantry of the MRI machine/device 192. The interface (optical output device 120, 220) may be integrated with other components of the disclosed system, especially with a camera device 110, 210, into a single enclosure or housing 304. The interface (optical output device 120, 220) may also work as a standalone device attached to the MRI machine/device 192 inside the gantry so that the patient has visual access to the interface (optical output device 120, 220). The role of the interface (optical output device 120, 220) is to present visual commands using various colors of light. Each color may have a meaning specified in the procedure, e.g. red color may mean "Remain still" (do not move), blue color may mean "Relax and wait for further instructions", green color may mean "start performing a task". Other meanings and/or colors are possible as well.

2) A camera device 110, 210 as well as 810b to 810d (if realized as camera), preferably integrated with communication interface or optical output device 120, 220 may be compatible with MRI and thus they may not introduce any artifact to the MRI image, even while working inside the gantry of the MRI device 192 or of the MRI machine. The camera device 110, 210 may be adjusted so that it can monitor the face of the subject, the chest of the subject, fingers of the subject or other parts of the subject's body, according to requirements of the procedure. The image from the camera device 110, 210 may be transmitted through optic fibers 272, 274 to technical room 294, where it can be visualized, recorded or analyzed on the external unit(s)/computing device(s) 260. The external unit (for instance computing device 260 or cloud computers) may incorporate algorithms that allow automatic image recognition and analysis, e.g. recognition of facial expressions and/or breath-rate calculation based on chest movements.

3) An MRI compatible control unit 230 as well as 230b to 230d comprising for instance a touch-screen, mounted on MRI scanner device 192 or in a very close distance to the scanner device 192, which allows for easy setup of the communication interface device 320 (optical output device) and/or the camera device 310. Control unit 230 (comprising for instance the touch screen) as well as 230b to 230d may provide access to control buttons, preferably within a digital user interface UI, to setup image parameters and preview of the camera field of view.

Groups of patients that may especially benefit are: pediatric patients, sedated patients, patients with claustrophobia, patients at risk of an epilepsy attack, patients using sign language.

Applications are:

MRI diagnostic examinations. The proposed systems 100 to 1000 may be designed for all diagnostic examinations carried out in MRI scanners 192. It may increase the safety and comfort of the subjects and may minimize the costs generated by the need to repeat unsuccessful tests.

fMRI examinations. Optical observation of hands, feet and other parts of the patient's body may allow controlling the correctness of the execution of commands (e.g. during the examination of fMRI paradigms).

cardiac MRI examinations. Thanks to the proposed system it may be possible to observe the chest and thus control whether the patient's respiratory rhythm is synchronized with the heart rhythm, which is very helpful in cardiologic MR examinations.

MRI examinations for people who do not speak, whose hearing is impaired or who are deaf. Thanks to the possibility of observing the hands, during the examination it may be possible to communicate with people who do not talk, whose hearing is impaired or who are deaf.

Benefits and capabilities are:

reduction of retesting: The scanner device 192 is a closed machine and the tester is located in another room 294. Without the proposed systems 100 to 1000 it may not be possible to see if the examined patient has open eyes and sees the displayed stimuli, or whether they execute commands and if they execute them correctly.

reduction of testing costs: Thanks to the camera device 110, 210 as well as 810b to 810d (if realized as camera) the number of failed tests and the need to repeat them may be minimized. This may save money and time for patients and healthcare professionals alike.

patient safety: Thanks to the camera device 110, 210 as well as 810b to 810d (if realized as camera or physiological data acquisition device, e.g. ECG or EEG) it is possible to check if the patient's anxiety is not growing and to control their well-being, vital functions, possible panic attacks, epilepsy attacks or fainting.

sedation examinations: It is very helpful during examinations of adults and children in sedated state, allowing to control whether the patient has not started to wake up.

comfort and legal aspect when examining children: The use of camera device 110, 210 as well as 810b to 810d (if realized as camera) is particularly important for children. It meets the legal requirement for a parent to be able to see his or her child during the examination. It also increases the psychological comfort of the parents, who can observe their child during the MRI examination. It also helps to make the experience easier for small patients.

Some possible technical parameters:

high-resolution color camera device 110, 210 as well as 810b to 810d (if realized as camera) (PAL/NTSC), and/or interchangeable lenses (for instance from 13.5° (angle degrees) to 160° opening angle), standard option: 120° for example, and/or built-in lamp/LED(s) with adjustable light intensity, and/or video signal may be optically transmitted (e.g. via optical fiber).

Other technical aspects:

functional housing 304 and frame 400 design to meet medical standards, and/or lightweight and easy to install structure, especially housing 304 and/or frame 400, and/or possibility of convenient hanging of the camera device 110, 210 as well as 810b to 810d (if realized as camera) on the scanner's device 192 gantry, and/or a tripod or stand or frame 400 that allows one to adjust camera device 110, 210 position as desired, and/or possibility of directing the camera device 110, 210 as well as 810b to 810d (if realized as camera) at any part of the patient's body.

FIG. 8 illustrates a transmission system 800 for the transmission of collected data or signals of an output unit 810b. Transmission system 800 may comprise several sending and receiving units 250b1, 250b2 and optionally further sending and receiving units 250bn where n is an integer, for instance in the range of 2 to 16 or a greater integer.

Furthermore, transmission system 800 may comprise:

a control unit 230b, and the output unit 810b.

The control unit 230b is explained in more detail below. Output unit 810b may be a camera (digital or analog), especially in combination with an optical output device 220 (illumination and/or signaling) as mentioned above, an audio device or a device that detects physiological parameters of a subject or patient.

Sending and receiving units 250b1, 250b2, 250bn may comprise the same components and may have the same structure as sending and receiving unit 250. Thus, each of the sending and receiving units 250b1, 250b2, 250bn may comprise:

a sending (transmitter) unit S2b1, S2b2 that may correspond to sending unit S2, a receiver unit R2b1, R2b2 that may correspond to receiver unit R2, a transceiver unit TR2b1, TR2b2 that may correspond to transceiver unit TR2 and that may be a radio transceiver unit, a respective forwarding unit (not shown) that may correspond to the forwarding unit that is mentioned above for sending and receiving unit 250, a respective optional interface unit IF (not shown) that may correspond to the interface unit IF that is mentioned above for sending and receiving unit 250, a splitting member 706b1, 706b2 that corresponds to splitting member 706 and that may comprise respective ports Z1, Z3 and Z4.

Sending and receiving units 250b1, 250b2, 250bn may be connected to a respective computing device (computer) as was mentioned above for sending and receiving unit 250 and computing device (computer) 260. Alternatively, the computing devices for the processing and/or displaying of collected data/signals may be comprised within sending and receiving units 250b1, 250b2, 250bn.

Sending (transmitter) unit S2b1, receiver unit R2b1, transceiver unit TR2b1, corresponding forwarding unit and corresponding optional interface unit IF may be comprised within a signal processing unit 822c1. Sending (transmitter) unit S2b2, receiver unit R2b2, transceiver unit TR2b2, corresponding forwarding unit and corresponding optional interface unit IF may be comprised within a signal processing unit 822c2.

Thus, sending and receiving units 250b1, 250b2, 250bn may be able to receive collected data or signals from output unit 810b and to display and/or to store and/or to forward these data/signals to respective computer devices as is explained above in detail for sending and receiving unit 250. Furthermore, sending and receiving units 250b1, 250b2, 250bn may allow to forward control signals to control unit 230b. This was explained above for as sending and receiving units 250 and control unit 230. Control unit 230b may confirm these control data/signals and may transfer corresponding control data or control signals to output unit 810. Furthermore, control unit 230b may be configured to forward control data/signals received from one of the sending and receiving units 250b1, 250b2, 250bn to a different one or to all of the sending and receiving units 250b1, 250b2, 250bn using for instance an appropriate address scheme and/or a broadcast message that is directed to all sending and receiving units 250b1, 250b2, 250bn. Thus, there may be a bifurcation or doubling of control data or control signals coming from one SRU in the direction of the output unit 810b and to at least one of the other SRUs. The doubling or bifurcation may be performed in CTU 812b. Thus, the other SRUs may be informed about control data and control signals that have been sent by other SRUs to the CTU and from there to output unit 810b. The other SRUs may perform for instance a corresponding internal status update. Conflicting control between different SRUs may be avoided because of the status update.

Control unit 230b may comprise:

a processing unit 812b (control transfer unit), a splitting unit 600b, an optional input/output splitting unit 814b, and further units for sending and receiving signals from/to splitting unit 600b and from/to output unit 810b.

The processing unit 812b may be a microprocessor or another processor or a state machine that does not comprise a processor which performs instructions of a program.

Splitting unit 600b may have the same structure and function as splitting unit 600. There may be for instance two splitting members 702b and 704b that correspond to splitting members 702 and 704. There may be the same connections between ports of splitting members 702b and 704b that are mentioned above for ports of the splitting members 702 and 704. Ports P1 to P4 of splitting unit 600b may correspond to ports P1 to P4 of splitting unit 600. There may be corresponding connections between ports of splitting members 702b and 704b and the ports P1 to P4 of splitting unit 600b compared to the connections that have been mentioned above for splitting unit 600.

An optional input/output splitting unit 814b may comprise a splitting member 816b or another optical coupling element. Splitting member 816b may comprise a port W1 on one end and two ports W3 and W4 on the opposite end. Port W1 may be coupled to port P2 of splitting unit 600b. The connection of ports W3 and W4 is described below. Splitting member 816b may be an optical coupler, for instance a 50:50 coupler a 75:25 coupler or a coupler having other ratios of coupling. Several splitting members 816b may be used to connect Port P2 to more than two sending and receiving units 250b1, 250b2, 250bn. A further splitting member that is similar to splitting member 816b may be connected for instance to port W3 of the first splitting member 816b with its port W1. The coupling ratios may be selected appropriately, e.g. the 75 percent of the first coupler are again split with a ratio of 25:75 allowing for instance to send 25 percent of the optical energy to sending and receiving unit 250b1, 25 percent to sending and receiving unit 250b2 and 50 percent to a third sending and receiving unit 250bn.

Alternatively, optional input/output splitting unit 814b may be arranged outside of control unit 230b, e.g. as a separate unit. This may allow it to use only a single optical fiber for a considerable length of the distances between the sending and receiving units 250b1, 250b2 and 250bn and the control unit 230b. There may be a further single optical fiber connection (bidirectional) between port P2 and Port W1 if optional input/output splitting unit 814b is a separate unit compared to control unit 230b. The length of this connection may be longer than 3 meters, longer than 5 meters but less than 100 meters, for instance. These lengths values may also be valid for system 900 and 1000 that are mentioned below.

Control unit 230b may comprise further units for sending and receiving signals from/to splitting unit 600b, e.g. a sending unit (not shown) that corresponds to sending unit S3, a receiver unit (not shown) that corresponds to receiver unit R3 and/or a transceiver unit TR3 (not shown) that is connected to the sending unit and to the receiver unit of control unit 203b as well as to the processing unit 812b. Transceiver unit TR3 may be a radio transceiver unit.

Control unit 230b may comprise further units for sending and receiving signals from/to output unit 810b via a control data or control signal transmission connection 820b. Within the control unit 230b, there may be for instance a power line transmission of control signals from control unit 230b to output unit 810b as mentioned above. The power line transmission may use electrical sending and electrical receiving elements, especially as mentioned above. Furthermore, the power line transmission may use FSK (Frequency Shift Keying) as mentioned above or ASK (Amplitude Shift Keying) or other appropriate keying schemes. Alternatively, another kinds of transmission of control signals from control unit 230b to output unit 810b may be used, for instance a optical transmission that is similar to the optical fiber transmission at the sending and receiving units 250b1, 250b2 and 250bn. As a further alternative, it is possible to use wireless transmission, e.g. using ultrasonic sound or light or electromagnetic waves for connection 820b.

Control unit 230b may be a touch screen unit, e.g. same as control unit 230, comprising additionally the optional input/output splitting unit 814b. Alternatively control unit 230b may not comprise a touch screen or other devices as an input/output means but may only forward control signals from the sending and receiving units 250b1 to 250bn to output unit 810b and/or send corresponding feedback or status signals to these sending and receiving units 250b1 to 250bn.

There may be the following connections between the units of the transmission system 800:
- a single optical fiber connection 284b1 that may be bidirectional and that may be arranged between port W4 of splitting member 816b and port Z1 of splitting member 706b1 of sending and receiving unit 250b1,
- a single optical fiber connection 284b2 that may be bidirectional and that may be arranged between port W3 of splitting member 816b and port Z1 of splitting member 706b2 of sending and receiving unit 250b,
- optional a further single optical fiber connection (not shown) that may be bidirectional and that may be arranged between additional ports of input/output splitting unit 814b and a port of a splitting member in sending and receiving unit 250bn,
- a single optical fiber connection 272b that may be a unidirectional connection from output device 810b to port P1 of splitting unit 600b or that may be a bidirectional connection, and
- the control data/signal transmission connection 820b between control unit 230b and output unit 810b, for instance a unidirectional connection to output unit 810b or preferably a bidirectional connections.

One of the following modulation schemes may be used in the transmission system 800 for the optical transmission of the control signals as well as in system 100 and 200: FSK (Frequency Shift Keying), GFSK (Gaussian Frequency Shift Keying), ASK (Amplitude Shift Keying), OOK (On-Off-Keying), GOOK (Gaussian On-Off-Keying). Analog Devices® Inc. IC's (Integrated Circuits) or IC's of other manufacturers may be used, For instance ADF7020-x, e.g. ADF7020-1 that is specified for frequency bands in the range from 135 MHZ to 650 MHz or in divide-by-2 mode for frequencies in the range of 80 MHz to 325 MHz.

As already mentioned above, within close distance to magnetic resonance imagining (MRI) devices there may be a strong magnetic field and electromagnetic waves in specific bandwidth may be used, e.g. between 60 MHz and 130 MHz. This may cause an electrical connection to work or operate ineffectively. Thus, it may be one possibility to transmit for instance video data/signals in the frequency range from 0 MHz to 60 MHz (megahertz) or in the range from 0 MHz to 50 MHz and to transmit the control signals in a range above 120 MHz, above 130 MHz or above 140 MHz, see especially the frequency ranges that are specified in the introduction part of this document. The technical effect may be enhanced if light is used as a carrier and/or if light is transmitted within an optical carrier, especially in a waveguide manner.

Broadcom® Inc. fiber optics sensors or transmitters may be used as well as appropriate sensors and transmitters of other manufacturers. Broadcom® HFBR-14xxZ may be used as transmitter (sending) unit. Broadcom® HFBR-24xxZ may be used as receiver unit.

Transmission system 800 may be used in an MRI environment, in another environment with strong magnetic and/or electromagnetic fields or in other environments, especially in medical environments or in non-medical environments.

If output unit 810b is a camera module, comprising for instance optical output device 220, the same control of LEDs or of other optical radiation elements or of signaling elements may be performed as mentioned above. Moreover, parameters of the camera may be set or may be read. If output unit 810b is a device for recording physiological parameters, other control functions may be performed, for instance selecting the amplification of sensor signals and/or selecting the bandwidth of adjustable band filters for sensor signals, etc.

FIG. 9 illustrates a first alternative transmission system 900 of transmission system 800 of FIG. 8 wherein a splitting unit 600c comprises the following four splitting members:
- a first splitting member 702c that corresponds to first splitting member 702, 702b,
- a second splitting member 704c that corresponds to second splitting member 704, 704b,
- a third splitting member 902 comprising or having one port U1 at one of its end and two ports U3 and U4 at its opposite end, and
- a fourth splitting member 904 comprising or having one port V1 at one of its end and two ports V4 and V3 at its opposite end.

A part of splitting unit 600c which comprises the first splitting member 702c and the second splitting member 704c has the same structure and function as splitting unit 600, 600b. However, an internal node/port N3 is located in splitting unit 600c instead of port P3 of splitting unit 600, 600b. Furthermore, an internal node/port N4 is arranged in splitting unit 600c instead of port P4 of splitting unit 600, 600b.

Internal node/port N3 is connected to port V1 of splitting member 904 by an optical connection. Port V3 of splitting member 904 may be connected to a port P3c of the splitting unit 600c. Port 3c is connected to an optical/electrical sending (transmitter) unit of control unit 230c that corresponds to sending (transmitter) unit S3 of control unit 230.

Port V4 of splitting member 904 may be connected to port U3 of splitting member 902. Port U4 of splitting member 902 is connected to a port P4c of splitting unit 600c. Port P4c is connected to an optical/electrical receiving unit of control unit 230c that corresponds to receiving unit R3 of control unit 230.

Splitting unit 600c may comprise an optional input/output splitting unit 814c that corresponds to optional input/output splitting unit 814b. Input/output splitting unit 814c may be a part of control unit 230c or it may be a separate unit.

The other components of transmission system 900 are the same or may be the same as the corresponding components of transmission system 800 and have the same structure and function, e.g.:
  sending and receiving units 250c1, 250c2, 250cn correspond to sending and receiving units 250b1, 250b2, 250bn,
  connections 272c, 284c1, 284c2 and 820c correspond to connections 272b, 284b1, 284b2 and 820b,
  output unit 810c corresponds to output unit 810b,
  processing unit 812c (control transfer unit) corresponds to processing unit 812b, and
  control unit 230c corresponds to control unit 230b except of the differences that are mentioned above.

Due to the two further splitting members 902 and 904, the multiple sending and receiving units 250c1, 250c2, 250cn may directly receive information on control signals coming from one of the other sending and receiving units 250c1, 250c2, 250cn. Thus, control data or control signals are transmitted between SRUs without involving the CTU 812c, for doubling or bifurcation of control data or control signals. However, due to the structure of the optical splitting unit 600c doubling or bifurcation of control data or control signals may be reached nevertheless. An appropriate address scheme and/or broadcasting message and/or protocol may be used.

System 900 may be used within MRI environment or within other environments as mentioned above for system 800.

Figure 10:
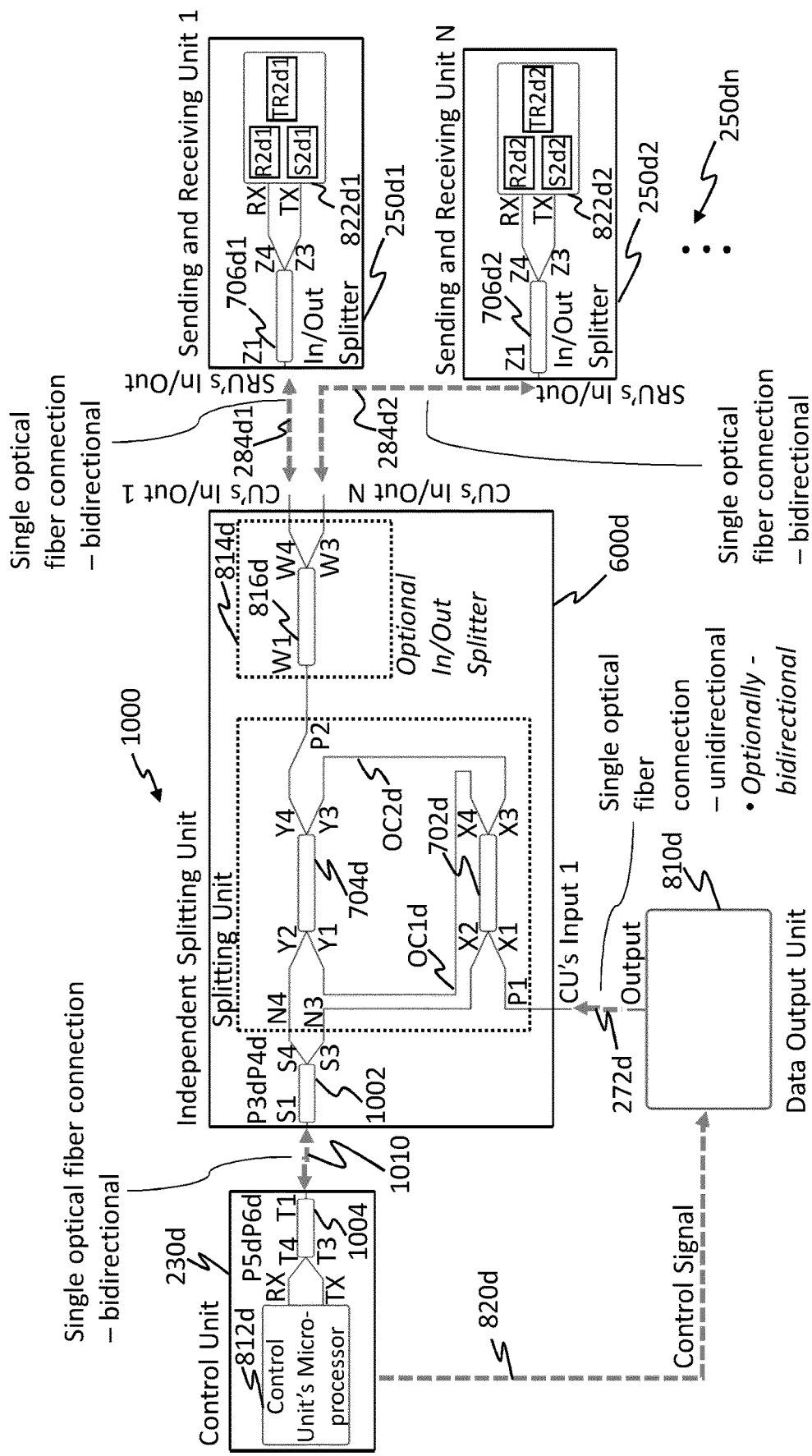

FIG. 10 illustrates a second alternative transmission system 1000 of the transmission system 800 of FIG. 8 comprising an independent splitting unit 600d that is a separate unit with regard to a control unit 230d. Splitting unit 600d comprises the following three splitting members:
  a first splitting member 702d that corresponds to first splitting member 702b,
  a second splitting member 704d that corresponds to second splitting member 704b, and
  a further splitting member 1002 comprising or having one (1) port S1 at one of its ends and two ports S3 and S4 at its opposite end.

A part of splitting unit 600d which comprises the first splitting member 702d and the second splitting member 704d has the same structure and function as splitting unit 600, 600b. However, an internal node/port N3 is located in splitting unit 600d instead of port P3 of splitting unit 600, 600b. Furthermore, an internal node/port N4 is arranged in splitting unit 600d instead of port P4 of splitting unit 600, 600b.

Internal node/port N3 is connected to port S3 of splitting member 1002 by an optical connection. Internal node N4 is connected to port S4 of splitting member 1002 by an optical connection. Port S1 of splitting member 1002 may be connected to a port P3d/P4d of the splitting unit 600d. There is single optical fiber connection 1010 that may be preferably bidirectional and that is connected to port P3d/P4d. The other end of single optical fiber connection 1010 may be connected with a combined input/output Port P5d/P6d of control unit 230d.

Splitting unit 600d may comprise an optional input/output splitting unit 814d that corresponds to optional input/output splitting unit 814b. Input/Output splitting unit 814d may be a part of independent splitting unit 600d or it may be a separate unit thereof, for instance in order to shorten the overall length of optical connections between sending and receiving units 250d1, 250d2, 250dn and splitting unit 600d in specific configurations.

Control unit 230d may comprise:
  a splitting member 1004 that comprises only one port T1 at one of its end and two ports T3 and T4 at the other end,
  a processing unit 812d (control transfer unit) or a state machine unit, see corresponding processing unit 812b,
  further units for sending and receiving signals from/to splitting unit 600d and from/to output unit 810d, see corresponding further units as mentioned above for control unit 230.

Thus, control unit 230d may comprise further units for sending and receiving signals from/to splitting unit 600d, e.g. a sending unit (not shown) that corresponds to sending unit S3, a receiving unit (not shown) that corresponds to receiver unit R3 and/or a transceiver unit TR3 (not shown) that is connected to the sending unit S3 and to the receiver unit R3 of control unit 203b as well as to the processor unit 812d. Transceiver unit TR3 may be a radio transceiver unit.

A combined port P5d/P6d of control unit 230d may be connected to port T1 of splitting member 1004. Port T3 of splitting member 1004 may be connected to the sending unit S3 of control unit 230d. Port T4 of splitting member 1004 may be connected to the receiver unit R3 of control unit 230d.

Control unit 230d may comprise further units for sending and receiving signals from/to output unit 810d. However, these units may be the same as those which are mentioned above for control unit 230b and 230c, e.g. powerline transmission or other kinds of transmission of control signals/data.

The other components of transmission system 1000 are the same or may be the same as the corresponding components of transmission system 800 and may have the same structure and function, e.g.:
  sending and receiving units 250d1, 250d2, 250dn correspond to sending and receiving units 250b1, 250b2, 250bn,
  connections 272d, 284d1, 284d2 and 820d correspond to connections 272b, 284b1, 284b2 and 820b,
  output unit 810d corresponds to output unit 810b,
  processor unit 812d corresponds to processor unit 812b, and control unit 230*d* corresponds to control unit 230*b* except of the differences that are mentioned above.

Due to the two further splitting members 1002 and 1004 splitting unit 600*d* may be a separate unit from control unit 230*d*. Splitting unit 600*d* may have a separate housing for the housing of control unit 600*d*. Splitting unit 600*d* may have no power supply because only passive optical components are used, e.g. splitting members and optical connections. There may be embodiments, wherein this feature may further simplify the setup and maintenance. Moreover, shorter overall lengths of optical fibers may be possible.

System 1000 may be used within MRI environment or within other environments as mentioned above for system 800.

According to a further embodiment, the embodiments of FIGS. 9 and 10 may be combined, e.g. there may be an independent splitting unit or other optical coupling unit comprising five splitting members in addition to the optional input/output splitting unit:
- a first splitting member that corresponds to splitting member 702*c*, 702*d*,
- a second splitting member that corresponds to splitting member 704*c*, 704*d*,
- a third splitting member that corresponds to splitting member 902,
- a fourth splitting member that corresponds to splitting member 904, and
- a fifth splitting member that corresponds to splitting member 1002.

Thus the independent or separate splitting unit may fulfill the same function compared to the functions of splitting unit 600*c*, e.g. it may be possible that the sending and receiving units SRU transmit control signals not only to control (transfer) unit but also to other sending and receiving units SRU without usage of a processor or state machine of the control unit or of the control transfer unit 812*d*. The technical effects of a separate splitting unit are maintained as well.

The combined system may be used within MRI environment or within other environments as mentioned above for system 800.

If the transmission system 100, 200, 800, 900, 1000 or the combined system is used in an MRI or other environment comprising strong magnetic and/or electromagnetic fields EMC (Electromagnetic Compatibility) protection may be reached by applying one of the following measures. The MRI protection may be realized considering two directions. The first direction is that the devices do not disturb the MRI process, for instance by generating artifacts that are visible in the MRT (Magnetic Resonance Tomography) image. The other direction is that the MRI device does not disturb the operation of the devices of the proposed transmission systems 100 to 1000. The devices of the proposed transmission systems 100 to 1000 may be shielded for instance with regard to electromagnetic waves, especially individually. Furthermore, single critical components may be shielded within a device of the proposed system, for instance a microprocessor, control circuits, transmission circuits and/or a camera sensor matrix. Copper, brass or other appropriate materials may be used as shielding materials.

Furthermore, electrical filtering on power lines may be used and/or on signals/data lines and/or control data/signals lines. Resistors combined with the capacitance of the circuits and/or with additional capacitors may create RC (Resistor Capacitor) filters. It is possible to empirically adjust the filters. Alternatively or additionally, results of circuit simulation may be used for adjustment.

The single optical fiber connections may be mono-mode or multi-mode optical fibers. Alternatively, other optical fibers may be used. The optical fibers may for instance comprise glass or plastics material. There may be no further connections in systems 110, 210, 800, 900 or 1000 in addition to the connections that are mentioned above and that are shown in the FIGS. 1 to 10.

Again, spoken with other words, changes with regard to the embodiment s that are shown in FIGS. 1 to 7 are:

The camera unit may be replaced by an output unit, for instance by a collected data output unit or a collected signal (e.g. analog) output unit, e.g. 810*b*, 810*c*, 810*d*. The output unit may output collected data/signals from at least one of a data acquisition system or from several data acquisition systems, e.g. a video camera and/or physiological data recording systems and/or audio system, wherein the collected data/signals may be transmitted preferably through single optical fiber in order to enable for instance low cost systems.

The control unit, e.g. 230, 230*b*, 230*c*, 230*d*, may comprise:
1) a control unit's (Micro)processor or a state machine without a processor. This part of the control unit may be referred to as control transfer unit. In the embodiments of FIGS. 1 to 7 the touch screen In, Mon is mentioned here. The touch screen In, Mon may remain in the embodiments of 8 to 10 as an example of optional graphical user interface to control the control unit or control transfer unit and finally the output unit 810*b* to 810*d*. Alternatively or additionally, the control (transfer) unit may be controlled from sending and receiving units (SRU), e.g. 250*b*1, 250*b*2, 250*bn*.
2) a splitting unit, e.g. 600, 600*b*, 600*c*, 600*d*, or another type of optical coupling unit. In the embodiment of FIG. 8 the splitting unit 600*b* may remain the same as in the previous embodiments of FIGS. 1 to 7. FIG. 9 illustrates an embodiment with a more complicated splitting unit 600*c* with added splitters described as new splitting member 3, e.g. 902, and new splitting member 4, e.g. 904. This configuration is an additional example of the implementation wherein multiple sending and receiving units SRU may directly receive information on control signal coming from one of the other sending and receiving units SRU. An appropriate address scheme of the sending and receiving units SRU may be used to differentiate between the respective sending and receiving units SRU. Alternatively, at least one broadcast message to all SRU may be sent by the respective SRU.

In the version that is illustrated in FIG. 8, this control communication between SRUs may work in the way that information on control signal/data may be sent from control (transfer) unit's (micro)processor/state machine for other sending and receiving units to preferably acknowledge, e.g. the processor/state machine of the control transfer unit (CTU) may first receive control data/signal from one of the SRU's and forward them thereafter to another of the SRU's. Again an appropriate address scheme of the sending and receiving units SRU may be used to differentiate between the respective sending and receiving units SRU. Alternatively, at least one broadcast message to all SRU may be sent by the CTU.

As is also valid for the embodiments of FIGS. 1 to 7, the splitting unit may be an integral part of the control unit, see control unit 230*b* in FIG. 8 and control unit 230*c* in FIG. 9, or may be a separate device which is presented in FIG. 10, control unit 230*d*.

3) an optional in (input)/out (output) splitting member or unit, e.g. 814*b*, 814*c*, 814*d*. This may be a new feature that allows introducing more than one connection to and/or from sending and receiving units SRU. Thus "multiple interfaces" are supported. It is not necessary to implement this splitting member if there is no need to use multiple SRUs. It should be noted, that each additional sending and receiving unit SRU may be connected via a single optical fiber connection. The in/out splitting member/unit may be integrated with the splitting unit. However it may also be a completely separate unit in form of for instance a 1-by-X splitting unit as those available on the market. X may be an integer number in the range of 2 to 16 for example. Other integer numbers for X are possible as well. In the case in which the in/out splitting member/unit is a separate unit from the optical splitting unit 600, 600*b* to 600*d*, the optical splitting unit 600, 600*b* to 600*d* would have only a single input/output port P2 to the side of the sending and receiving units SRU. This may simplify the structure of the modified optical splitting unit 600, 600*b* to 600*d*.

Described is a transmission system including a data output unit, for instance a camera operating within MRI environment. In an embodiment, a main control unit may manage the operation of the data output unit, wherein the main control unit (control transfer unit, primary control unit) may be preferably located closely to data output unit, e.g. mounted in vicinity of MRI device or within a radius of less than 5 meters or less than 3 meters from the MRI device. The control device may have one or multiple connection to additional secondary (e.g. indirect control of output unit via control (transfer) unit) control units, e.g. sending and receiving units. Each of the sending and receiving units and/or the main control unit may be capable of receiving the data from the data output unit, send control signals and acknowledge control signals issued by other sending and receiving unit and/or by the control (transfer) unit. Each pair of optically coupled units may be connected via single optical fiber connection.

Although embodiments of the present disclosure and their advantages have been described in detail, it should be understood that various changes, substitutions and alterations can be made therein without departing from the spirit and scope of the disclosure as defined by the appended claims. For example, it will be readily understood by those skilled in the art that many of the features, functions, processes and methods described herein may be varied while remaining within the scope of the present disclosure. Moreover, the scope of the present application is not intended to be limited to the particular embodiments of the system, process, manufacture, method or steps described in the present disclosure. As one of ordinary skill in the art will readily appreciate from the disclosure of the present disclosure, systems, processes, manufacture, methods or steps presently existing or to be developed later that perform substantially the same function or achieve substantially the same result as the corresponding embodiments described herein may be utilized according to the present disclosure. Accordingly, the appended claims are intended to include within their scope such systems, processes, methods or steps.

The embodiments mentioned in the first part of the description may be combined with each other. The embodiments of the description of FIGS. 1 to 10 may also be combined with each other. Thus, the embodiments that are described with relation to FIGS. 1 to 7 may also be modified by using several sending and receiving units SRU that are included in system 100 and 200 in the same way as described with regard to the embodiments of FIGS. 8 to 10. Further, it is possible to combine embodiments mentioned in the first part of the description with examples of the second part of the description which relates to FIGS. 1 to 10.

The invention claimed is:

1. Transmission system for transmitting output unit signals and control signals between multiple optically coupled units, wherein at least one pair, at least two pairs, or each pair of optically connected units is connected via an optical transmission connection based on a respective single optical fiber, wherein the transmission system comprises the following optically coupled units:

an output unit that outputs collected data or collected signals via a first optical transmission connection that is realized by a unidirectional or bidirectional first single optical fiber, wherein the output unit comprises a camera or wherein the output unit is configured to output physiological data or at least one physiological signal, at least one sending and receiving unit or at least two sending and receiving units, each sending and receiving unit configured to simultaneously receive the collected data or the collected signals and to send external control data or control signals via at least one second optical transmission connection that is realized by at least one bidirectional second single optical fiber, an optical coupling unit that is coupled optically between the output unit and the at least one sending and receiving unit or between the output unit and the at least two each of the sending and receiving units, a control transfer unit that is configured to receive the external control data or control signals from the at least one sending and receiving unit or from the at least two sending and receiving units via the optical coupling unit, wherein the control transfer unit is configured to control the output unit depending on the received external control signals or control data, wherein the optical coupling unit is an optical splitting unit comprising a first port, a second port, a first splitting member and a second splitting member, wherein the first splitting member comprises a first port, a second port, a third port and a fourth port and wherein the second splitting member comprises a first port, a second port, a third port and a fourth port, wherein the first port of the optical splitting unit is connected to the first port of the first splitting member, the second port of the splitting unit is connected to the fourth port of the second splitting member, the fourth port of the first splitting member is connected to the first port of the second splitting member, and the third port of the first splitting member is connected to the third port of the second splitting member.

2. Transmission system according to claim 1, comprising a first sending and receiving unit of the at least one sending and receiving unit or of the at least two sending and receiving units, wherein the first sending and receiving unit comprises a receiver unit that comprises an optoelectronic input element that receives light and outputs an electrical signal, and wherein the first sending and receiving unit comprises a transmitter unit that comprises an optoelectronic output element that converts an electrical signal in a light signal, and wherein the first sending and receiving unit is optically coupled to the optical coupling unit by a first one of the at least one second optical transmission connection, and/or wherein the transmission system comprises a second sending and receiving unit of the at least two sending and receiving units, wherein the second sending and receiving unit comprises a receiver unit that comprises an optoelectronic input element that receives light and outputs an electrical signal, wherein the second sending and receiving unit comprises a transmitter unit that comprises an optoelectronic output element that converts an electrical signal in a light signal, and wherein the second sending and receiving unit is optically coupled to the optical coupling unit by a second one of the at least one second optical transmission connection.

3. Transmission system according to claim 2, wherein the first sending and receiving unit is connected to the optical coupling unit only by the first one of the at least one second optical transmission connection, and/or wherein the second sending and receiving unit is connected to the optical coupling unit only by the second one of the at least one second optical transmission connection.

4. Transmission system according to claim 2, wherein the output unit comprises a transmitter unit that comprises an optoelectronic input element that converts an electrical signal in a light signal, wherein the transmitter unit of the output unit and the transmitter unit of the first sending and receiving unit are configured to transmit at the same time, and/or wherein the transmitter unit of the output unit and the transmitter unit of the second sending and receiving unit are configured to transmit at the same time.

5. Transmission system according to claim 2, wherein the control transfer unit is configured to be coupled or is coupled to the optical coupling unit by a receiver unit that is configured to receive the external control data or control signals, wherein the control transfer unit is configured to be connected or is connected to one side of a control connection between the control transfer unit and the output unit, wherein the output unit is configured to be connected or is connected with another side of the control connection, and wherein the control transfer unit comprises a forwarding unit that forwards the external control data or control signal via the control connection to the output unit.

6. Transmission system according to claim 5, wherein the control connection is a separate physical connection with regard to the at least one first optical transmission connection and/or with regard to the at least one second optical transmission connection, and/or wherein the control connection is configured to use at least one communication protocol and/or physical communication interface that is different from a communication protocol and/or physical communication interface which is used for the transmission via the at least one first optical transmission connection and/or for to the transmission via the at least one second optical transmission connection.

7. Transmission system according to claim 5, wherein the control transfer unit comprises a transmitter unit that comprises an optoelectronic output element that converts an electrical signal in a light signal and that is configured to be optically coupled or that is optically coupled to the optical coupling unit.

8. Transmission system according to claim 7, wherein the control transfer unit is configured to send control data or control signals by the transmitter unit to the at least one sending and receiving unit or to the at least two sending and receiving units.

9. Transmission system according to claim 5, wherein the control transfer unit comprises a receiver unit that comprises an optoelectronic output element that converts a light signal in an electrical signal and that is configured to be optically coupled or that is optically coupled to the optical coupling unit, wherein the control transfer unit is configured to receive the collected data or the collected signal from the output unit via the optical coupling unit by the receiver unit, wherein the control transfer unit is configured to receive the external control data or control signals via the receiver unit.

10. Transmission system according to claim 1, wherein the control transfer unit comprises an input unit, wherein the input unit is configured to receive manual input in order to control the operation of output unit.

11. Transmission system according to claim 1, wherein the optical splitting unit comprises a third port and a fourth port, wherein the third port of the optical splitting unit is connected to the second port of the first splitting member, and the fourth port of the optical splitting unit is connected to the second port of the second splitting member.

12. Transmission system according to claim 1, wherein the optical splitting unit comprises a third port and a fourth port, a third splitting member and a fourth splitting member, wherein the third splitting member comprises a first port, a second port and a third port, wherein the fourth splitting member comprises a first port, a second port and a third port, wherein the first port of the third splitting member is connected to the second port of the second splitting member, wherein the second port of the third splitting member is a fourth port of the optical splitting unit, wherein the third port of the third splitting member is connected to the second port of the fourth splitting member, wherein the first port of the fourth splitting member is connected with the second port of the first splitting member, and wherein the third port of the fourth splitting member is a third port of the optical splitting unit.

13. Transmission system according to claim 1, wherein the optical splitting unit comprises a third splitting member, wherein the third splitting member comprises a first port, a second port and a third port, wherein the second port of the third splitting member is connected to the second port of the second splitting member, wherein the third port of the third splitting member is connected to the second port of the first splitting member, and wherein the first port of the third splitting member forms a third port and/or a fourth port of the optical splitting unit, or transmission system according to claim 12, wherein the optical splitting unit comprises a fifth splitting member, wherein the fifth splitting member comprises a first port, a second port and a third port, wherein the second port of the fifth splitting member is connected to the fourth port of the optical splitting unit, wherein the third port of the fifth splitting member is connected to the third port of the optical splitting unit, and wherein the first port of the fifth splitting member forms a fifth port and/or a sixth port of the optical splitting unit.

14. Transmission system according to claim 1, wherein the optical splitting unit comprises an input/output splitting unit, wherein the input/output splitting unit comprises a first port, a second port and at least a third port, wherein the first port of the input/output splitting unit is connected with the second port of the optical splitting unit, wherein the second port of the input/output splitting unit is a further port of the optical splitting unit, and wherein the third port of the input/output splitting unit is another port of the splitting unit that is different from the further port of the splitting unit.

15. Transmission system according to claim 1, wherein the optical coupling unit comprises at least a first port, a second port, a third port and a fourth port, wherein the first port is connected to the first optical transmission connection between the optical coupling unit and the output unit, wherein the second port is connected to at least one of the second optical transmission connections between the optical coupling unit and the at least one sending and receiving unit or between the optical coupling unit and the at least two sending and receiving units, wherein the third port is connected to the control transfer unit, wherein the fourth port is also connected to the control transfer unit, and wherein the optical coupling unit is configured to forward collected data or collected signals of the output unit from the first port to the second port and/or to the fourth port, to forward control data or control signals from the third port to the second port and/or to forward control data or control signals from the second port to the fourth port.

16. Transmission system according to claim 1, wherein the optical coupling unit is comprised in one housing together with the control transfer unit forming a control unit, or wherein the optical coupling unit is a separate unit from a control unit that comprises the control transfer unit.

17. Transmission system for transmitting output unit signals and control signals between multiple optically coupled units, wherein at least one pair, at least two pairs, or each pair of optically connected units is connected via an optical transmission connection based on a respective single optical fiber, wherein the transmission system comprises the following optically coupled units:

an output unit that outputs collected data or collected signals via a first optical transmission connection that is realized by a unidirectional or bidirectional first single optical fiber, wherein the output unit comprises a camera or wherein the output unit is configured to output physiological data or at least one physiological signal, at least one sending and receiving unit or at least two sending and receiving units, each sending and receiving unit configured to simultaneously receive the collected data or the collected signals and to send external control data or control signals via at least one second optical transmission connection that is realized by at least one bidirectional second single optical fiber, an optical coupling unit that is coupled optically between the output unit and the at least one sending and receiving unit or between the output unit and the at least two each of the sending and receiving units, a control transfer unit that is configured to receive the external control data or control signals from the at least one sending and receiving unit or from the at least two sending and receiving units via the optical coupling unit, wherein the control transfer unit is configured to control the output unit depending on the received external control signals or control data, wherein at least some units of the transmission system are configured to operate in an environment comprising magnetic fields of at least 0.5 T, at least 1 T or at least 2 T.

18. Transmission system for transmitting output unit signals and control signals between multiple optically coupled units, wherein at least one pair, at least two pairs, or each pair of optically connected units is connected via an optical transmission connection based on a respective single optical fiber, wherein the transmission system comprises the following optically coupled units:

an output unit that outputs collected data or collected signals via a first optical transmission connection that is realized by a unidirectional or bidirectional first single optical fiber, wherein the output unit comprises a camera or wherein the output unit is configured to output physiological data or at least one physiological signal, at least one sending and receiving unit or at least two sending and receiving units, each sending and receiving unit configured to simultaneously receive the collected data or the collected signals and to send external control data or control signals via at least one second optical transmission connection that is realized by at least one bidirectional second single optical fiber, an optical coupling unit that is coupled optically between the output unit and the at least one sending and receiving unit or between the output unit and the at least two each of the sending and receiving units, a control transfer unit that is configured to receive the external control data or control signals from the at least one sending and receiving unit or from the at least two sending and receiving units via the optical coupling unit, wherein the control transfer unit is configured to control the output unit depending on the received external control signals or control data, comprising a first sending and receiving unit of the at least one sending and receiving unit or of the at least two sending and receiving units, wherein the first sending and receiving unit comprises an optical receiver unit that comprises an optoelectronic input element that receives light and outputs an electrical signal, and wherein the first sending and receiving unit comprises an optical transmitter unit that comprises an optoelectronic output element that converts an electrical signal in a light signal, and wherein the first sending and receiving unit is optically coupled to the optical coupling unit by a first one of the at least one second optical transmission connection, wherein a first receiving and sending unit of the at least one sending and receiving unit or of the at least two sending and receiving units comprises a radio transceiver circuitry that is connected to the optical transmitter unit of the first receiving and sending unit and to the optical receiver unit of the first receiving and sending unit, and a) at least one interface unit to at least one computing device that is configured to process the collected data or collected signals or b) alternatively at least one computing device that is configured to process the collected data or collected signals.

19. Transmission system according to claim 18, wherein the radio transceiver circuitry of the first receiving and sending unit of the at least one sending and receiving unit or of the at least two sending and receiving units is configured to perform a frequency shift keying and/or an amplitude shift keying in the radio frequency range, and/or wherein the radio transceiver circuitry of the second receiving and sending unit of the at least two sending and receiving units is configured to perform a frequency shift keying and/or an amplitude shift keying in the radio frequency range, and/or wherein the output unit is configured to transmit data or signals within a transmission bandwidth in the range of 0 MHz to 60 MHz, and/or wherein the transmission system is configured to transmit control signals or control data using transmission bandwidth over 125 MHz.

20. Transmission system according to claim 19, wherein at least some units of the transmission system are configured to operate in an environment comprising magnetic fields of at least 0.5 T, at least 1 T or at least 2 T.

21. Transmission system according to claim 19, wherein the transmission system is configured to transmit control signals or control data using a transmission frequency in the range of 140 MHz to 180 MHz.

* * * * *